(12) United States Patent
Severson et al.

(10) Patent No.: US 6,222,708 B1
(45) Date of Patent: Apr. 24, 2001

(54) ROBUST POWER CONNECTION WITH REDUNDANT SURFACES TO ALLOW ARCING FOR HOT-PLUG APPLICATIONS IN COMPUTER SYSTEMS

(75) Inventors: Paul Steven Severson, Rochester; Paul Jon Thomford, Zumbrota; Douglas Allan Kuchta, Rochester, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/275,579

(22) Filed: Mar. 24, 1999

(51) Int. Cl.[7] .................................................. H02H 3/00
(52) U.S. Cl. ................... 361/2; 361/220; 710/103
(58) Field of Search ................... 361/212, 220, 361/110–111, 2; 307/149–150; 710/100–103

(56) References Cited

U.S. PATENT DOCUMENTS

| | | | |
|---|---|---|---|
| 4,791,524 | * 12/1988 | Teigen et al. ...................... | 361/212 |
| 5,431,576 | * 7/1995 | Matthews .............................. | 439/247 |
| 5,434,752 | * 7/1995 | Huth et al. ............................ | 361/798 |
| 5,575,690 | * 11/1996 | Eaton ................................... | 439/717 |
| 5,652,697 | * 7/1997 | Le ........................................ | 361/788 |

* cited by examiner

Primary Examiner—Michael J. Sherry
(74) Attorney, Agent, or Firm—Karuna Ojanen

(57) ABSTRACT

An electrical connection assembly for use in computer systems is disclosed. In the preferred embodiment, the computer system contains a backplane circuit card assembly for distribution of electrical signals to one or more pluggable modules. The modules are plugged into the backplane of the computer system without interrupting power to the computer system. The robust power connection is over-rated for the actual current and voltage delivered to the pluggable modules; and if any damage does occur at the point of initial contact, the connector surfaces are wiped beyond the initial contact point to the site of actual electrical contact which can occur at any place on a plurality of redundant surfaces. In this fashion, the connector assembly tolerates the arcing that occurs when the module is plugged into power grid on the backplane.

7 Claims, 23 Drawing Sheets

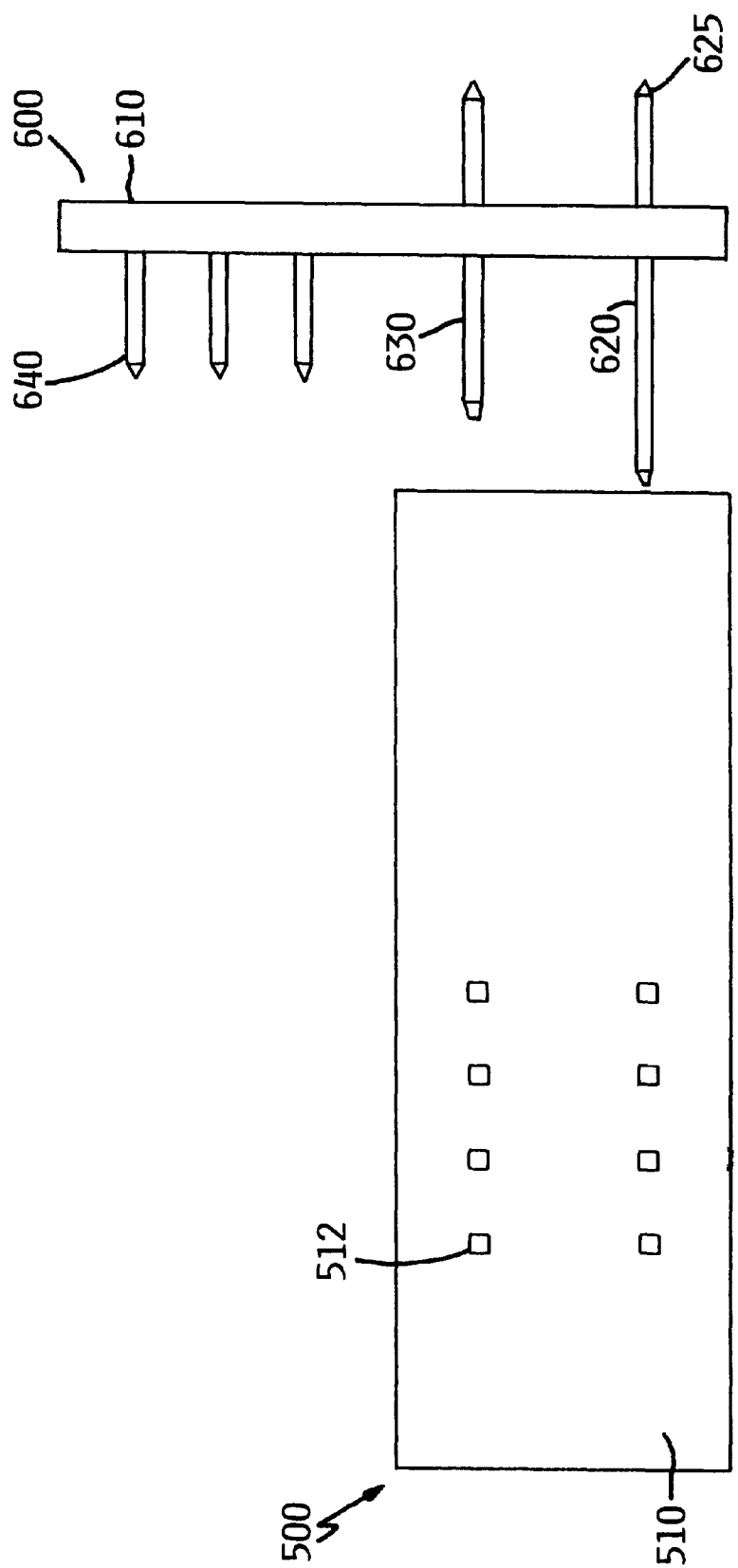

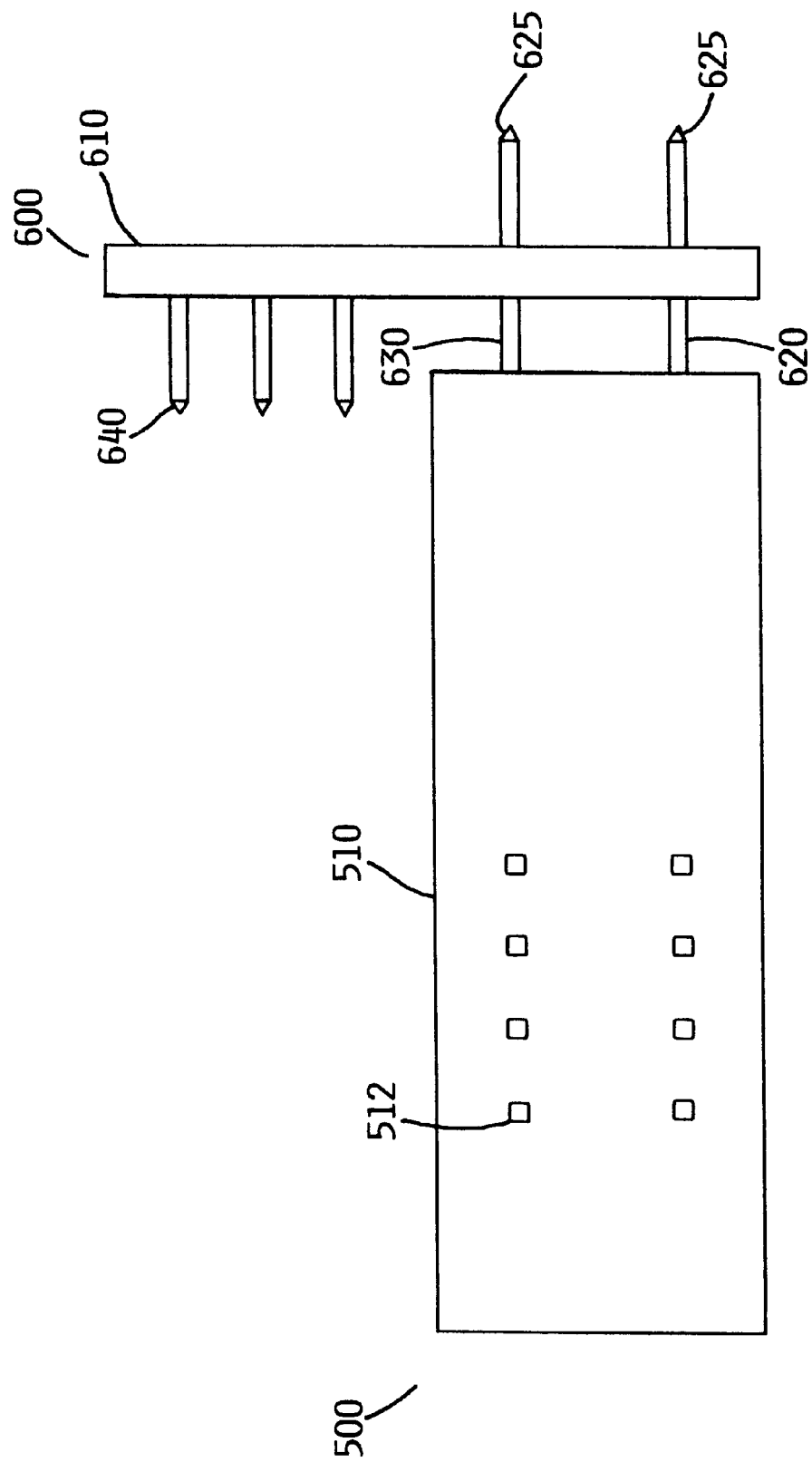

ROBUST POWER CONNECTION WITH REDUNDANT SURFACES TO ALLOW ARCING FOR HOT-PLUG APPLICATIONS IN COMPUTER SYSTEMS

TECHNICAL FIELD

This invention relates generally to field of electrical connectors and more particularly relates to providing a hot-plug connector that will tolerate arcing for use with replaceable computer modules.

BACKGROUND OF THE INVENTION

The spectacular proliferation of electronic devices, particularly computers, in modern society, both in numbers and complexity, demands that such devices satisfy ever increasing standards of reliability and serviceability to avoid degeneration into chaos. In the early days of the computer industry, relatively high failure rates and corresponding "down time" when the computer system was unavailable to perform useful work were accepted as the norm. As the industry matured, computers became more reliable and users now rely on computer systems to be available when needed. This dependence has become so profound that, for many businesses, the mere unavailability of the computer system for any appreciable length of time may cause significant commercial injury.

In the early days of the computer industry, a computer component was replaced by shutting off power to the system, replacing the component, and re-powering the system. This is, of course, a logical way to fix a toaster, but the complexity of modern computers makes this undesirable. It is not possible to simply shut off power and turn it back on as one would a light bulb. A computer system's state and data must be saved when it is powered down. Its software must be re-loaded and its state restored when it is re-powered. For a large modern computer system, these operations can take a very significant amount of time, during which the system is unavailable to its customers.

Computer manufacturers are well aware of the dependence of their customers, and have accordingly devoted considerable attention to these problems. As a result, many modern computer system have some degree of fault tolerance and are capable of concurrent maintenance. Fault tolerance means simply that a single component of the computer system may fail without bringing the entire system down although in some cases performance of the system or some other characteristic may be adversely affected. Concurrent maintenance is the capability to repair or replace some component of a computer system without shutting down the entire system so that the system can continue to operate and perform useful work although possibly in a diminished capacity while the repair is being performed. Concurrent maintenance, also called hot-swap or hot-plug, is a common service goal for the replacement of parts. A system which is both fault tolerant and capable of concurrent maintenance can, in theory, be kept running twenty-four hours a day for an indefinite length of time. In fact few, if any, systems achieve this level of reliability with respect to every component which may possibly fail.

Electronic systems frequently use backplane circuit cards for distribution of power, data signals, and/or mounting of active or passive circuit elements and connectors. Such a card typically contains multiple parallel layers for embedded circuit patterns, grounds, or power distribution. Pluggable connectors couple the backplane to other modules which make up the electronic system, such as power supply modules, storage devices, or logic cards. Often, such a backplane card acts primarily as a distribution medium for power and/or data signals from one pluggable module, also called field replaceable units (FRUs), to another. Relatively few functional components are attached directly to the backplane itself.

As modern computer systems improve in sophistication and reliability, and users come to rely with greater dependence on the continuing availability of their systems, it is increasingly important to provide concurrent maintenance capability in computer systems.

The electrical problem, however, of concurrent maintenance is that arcing on the connector pins on a pluggable module will occur as the new powered-off module is installed into the powered-up system, typically by plugging the module directly into the backplane. As the connector mates there is an arc resulting from the difference in voltage between the powered-on system and replacement module, and a resulting current spike occurs as the discharged capacitance of the new module is charged up to the level provided by the backplane. This problem is usually not severe enough to require special precautions in the case of logic level connections because the voltage, current, and capacitance levels are sufficiently low and do very little, if any, damage to the connector pins. In the case of power connections along the backplane which can be on the order of fifty volts and sixty amperes, however, the voltage and/or current and the capacitive levels are relatively high and can damage the connections.

The problem of arcing is usually addressed by limiting the current in the power path during the installation procedure. One solution has been to add an active device, usually a field effect transistor (FET), in the power path to limit voltage and current during the hot-plug. During normal operation the device is operated in saturation mode to minimize the series resistance. Typically, the inclusion of an FET to reduce the current during hot-plugging requires control logic whose complexities will vary depending upon the application.

Another solution to limit the current during concurrent maintenance is to place a device such as a thermistor in the power path. The thermistor or other device is at high impedance or is "cold" when the device is first installed. Then as power runs through the device, the thermistor heats up and its impedance dramatically decreases. During normal operation the series resistance of the thermistor or other device is as low as possible. Attention must be given to the design to ensure the impedance, both when hot and cold, is proper and that the device is always cold when hot-plugged. For instance, if the unit being serviced is installed, removed, and installed again with the thermistor hot and in a low resistance state, the protection for current limiting will be effectively circumvented. Arcing will occur that may damage the connector or otherwise affect operation. This can happen because the discharge time of the input capacitance of the unit is usually, very much shorter than the cool down time of the thermistor.

Yet a third technique to limit current during concurrent maintenance is to add impedance in the power path and later short out the impedance with a method, an example of which may include inserting a relay into the power path. This technique to short the impedance requires additional control logic. If the impedance path is implemented using a long connector pin which is the pin that first makes contact between the hot connector and the cold connector, the impedance can later be shorted out with a short connector pin in the connector which makes the last connection. The problem that occurs with this method is that there must be sufficient time to charge-up the input capacitance of the replacement part to the level of its powered up circuit path before the impedance is shorted. The time constant can be managed by controlling the velocity of the insertion so that the distance between the long connector pin and the short connector pin is traveled in no less than the capacitive charge-up time required but this technique adds mechanical complexity to the implementation.

The problem is that all of the above implementations add components, cost, failure rate, and complexity and often have a detrimental affect on efficiency. Thus there exists a need for hot plugging a connector for which can be efficiently accomplished with minimal time.

SUMMARY OF THE INVENTION

It is therefore an object of the present invention to provide an enhanced robust connector system for computer systems having field replaceable units. Another object of this invention is to provide an enhanced backplane connection system for use in electronic systems.

An electronic system, such as a digital computer system or a subsystem thereof contains a backplane circuit card assembly for supporting pluggable modules and which distributes power and/or data signals in a continuously run computer system modules through hot pluggable connectors. The robust connector system permits concurrent maintenance by tolerating arcing on the electrical connections that occurs as a new powered-off module is installed or hot-plugged into a powered system because it is over-rated and provides redundant surfaces on which electrical contact occurs.

The details of the present invention, both as to its structure and operation, can best be understood in reference to the accompanying drawings in which like numerals refer to like parts, and in which:

BRIEF DESCRIPTION OF THE DRAWING

FIGS. 5a, 5b, and 5c are plan views.

FIGS. 7a, 7b, and 7c are plan views.

DETAILED DESCRIPTION OF THE PREFERRED EMBODIMENT

Figure 1:
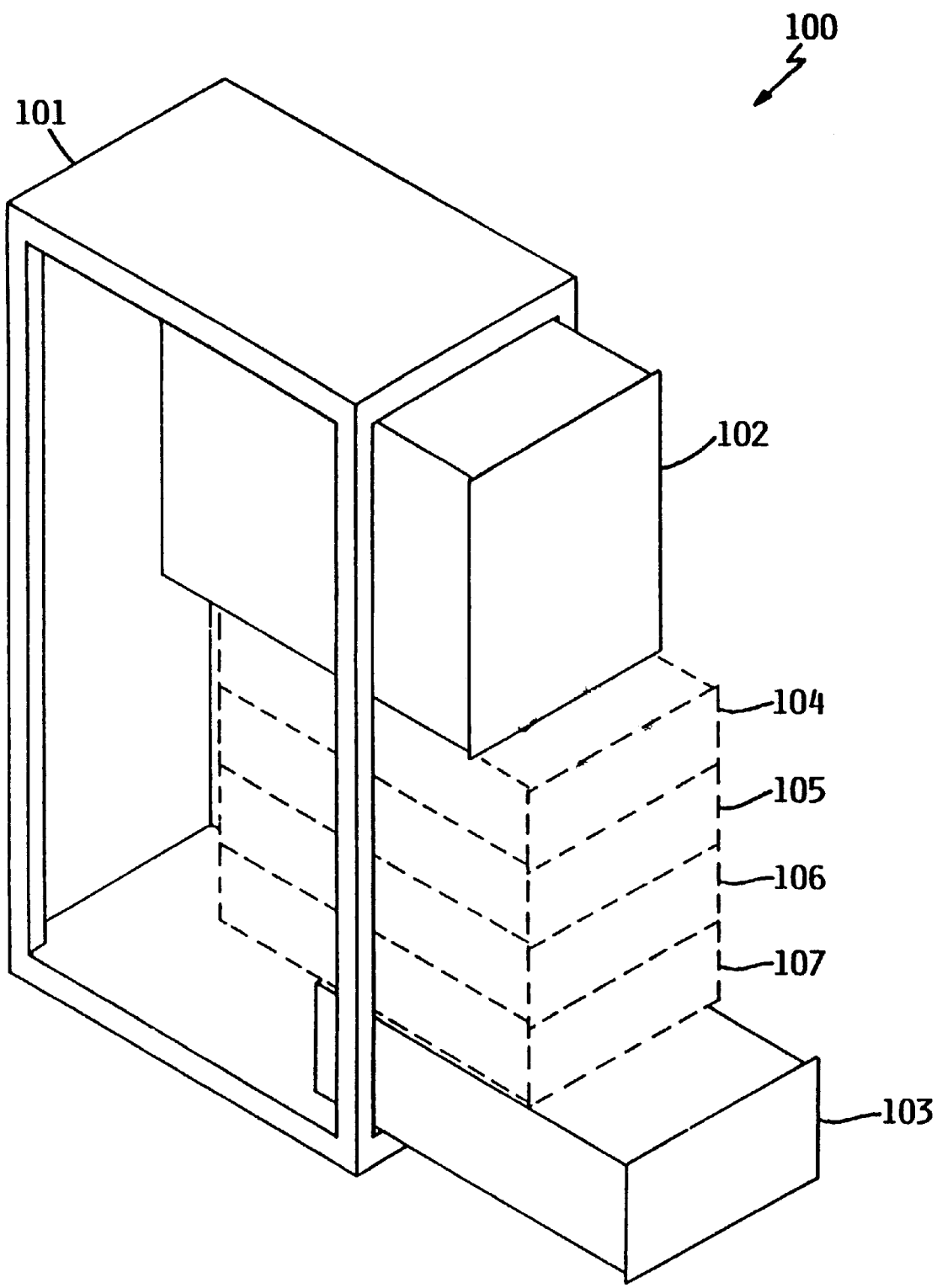
FIG. 1 shows the major components of a computer system using a backplane circuit card in accordance with the preferred embodiment of the present invention.

FIG. 1 is a high level representation of the major components of server system 100 employing the backplane circuit cards. Server system may be, for example, an intelligent and redundant mass repository of data, which it provides on demand to multiple host computer systems which are connected to server system 100. System 100 comprises a frame 101 for housing various electronic modules. These modules are shown in FIG. 1 in slide-out position for illustrative purposes, it being understood that during normal operation the modules are fully inserted in frame 101.

Near the top of the interior of frame 101 is an electronics drawer assembly 102. Electronics drawer 102 provides the basic logic and memory functions for operation of system 100. The components and function of electronics drawer 102 are explained in greater detail below with respect to FIG. 2.

At the bottom of frame 101 is power drawer 103, which converts power from an external source to a voltage which is distributed to the various drawers. Specifically, power drawer 103 contains a pair of redundant power supplies, each power supply converting standard AC line voltage to 350 volts DC for internal distribution within frame 101. Separate power distribution cables run from each power supply in power drawer 103 to electronics drawer 102 and each storage drawer 104–107, so that 350 volts DC power is provided to each drawer in a redundant fashion, enabling system 100 to continue operation even if one of the 350 volts DC power supplies fails.

Beneath electronics drawer 102 are several storage drawers 104–107, each of which may contain multiple rotating magnetic disk storage devices for storing data. The multiple rotating magnetic disk storage devices store data in a redundant fashion. Additionally, electronics drawer 102 contains hardware and software necessary to reconstruct data stored in any non-functioning disk storage device, and to store this data on a spare or replacement storage device. Thus, data stored on system 100 is available, even though the storage device on which the data was stored is itself incapable of providing the data.

Figure 2A:
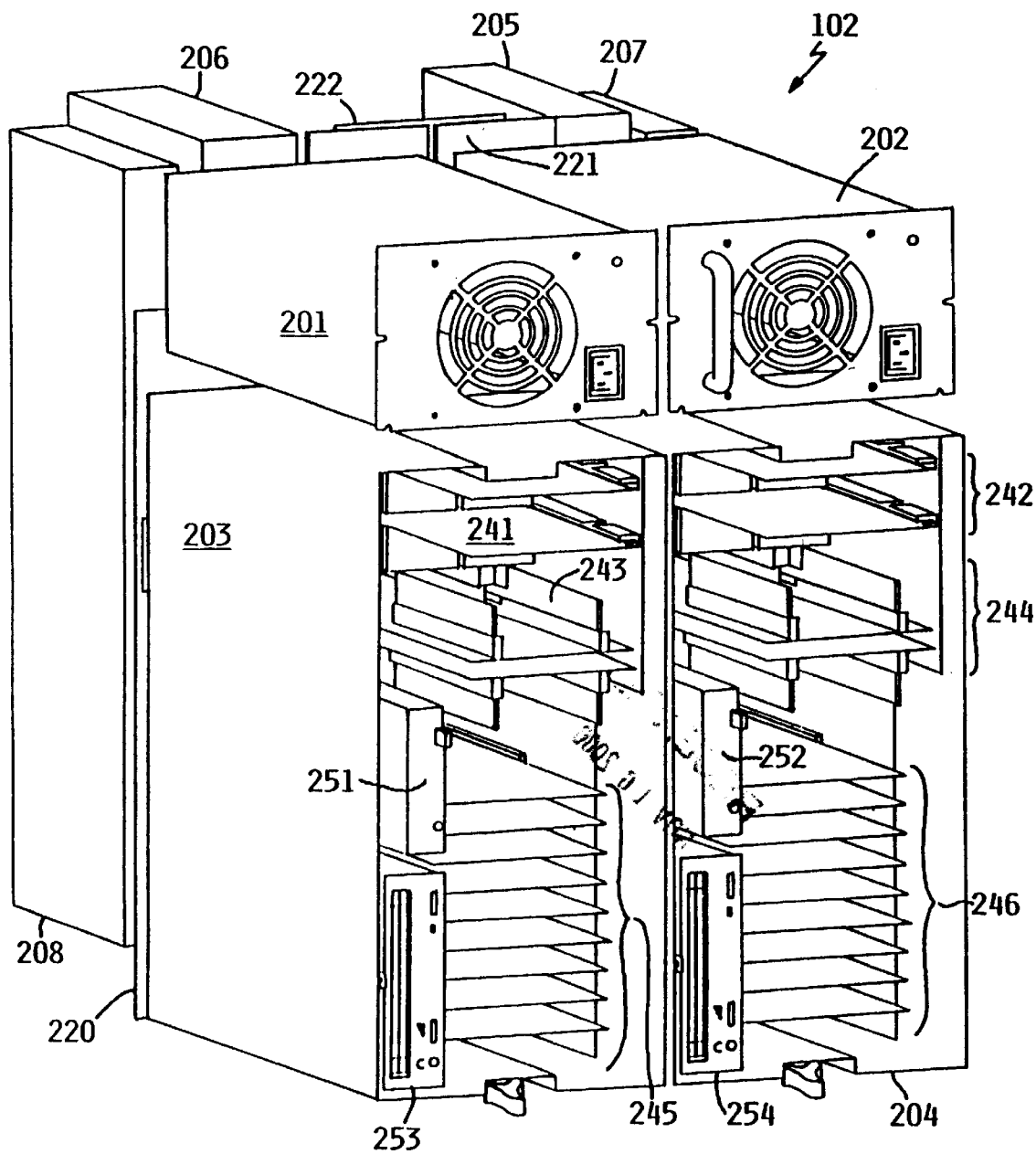
FIGS. 2A and 2B are isometric perspective views of the electronics drawer according to the preferred embodiment.
Figure 2B:
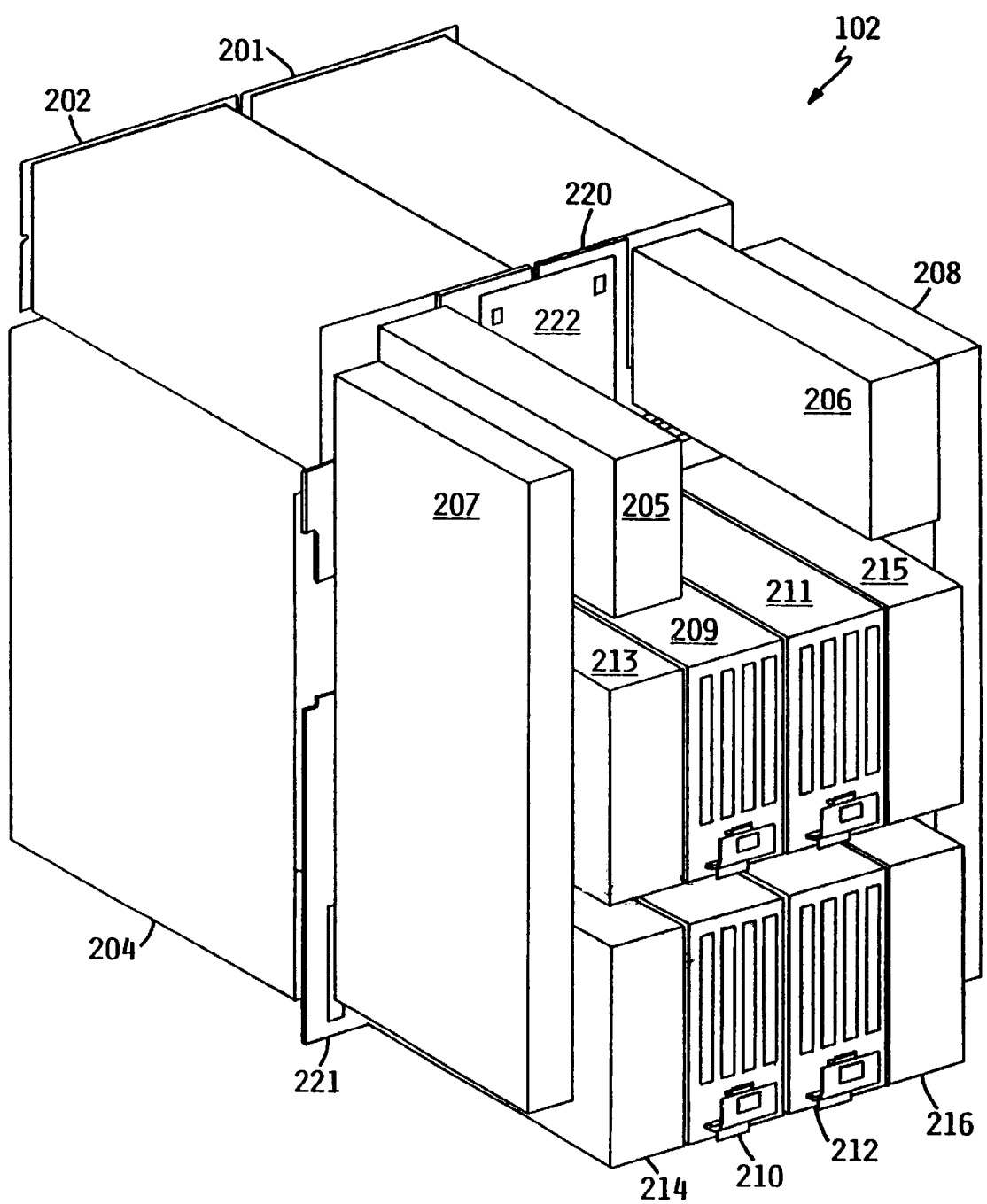

FIGS. 2A and 2B show in greater detail the major interior functional components of electronics drawer assembly 102. FIG. 2A is an isometric perspective front view of electronics drawer 102, while FIG. 2B is an isometric perspective rear view of drawer 102. In general, drawer 102 is housed in a frame (not shown) and includes left and right halves, the functional components of drawer 102 being duplicated in each half. Drawer 102 includes left power supply 201 and right power supply 202. These are essentially identical units, each of which receives 350 volts DC power from power drawer 103, and converts it to 48 volts DC power for distribution within electronics drawer 102.

Drawer 102 further includes left card cage 203 and right card cage 204. Card cages 203, 204 are essentially duplicates of each other, and house electronic circuit cards and other modules which perform the basic logical functions of system 100. Specifically, left cage 203 includes processor cards 241 which form the central processing unit (CPU), memory cards 243 which store programs and other data for processing by the CPU, I/O cards 245 which provide an interface between I/O devices and modules and a system bus, diskette drive 251 and CD/ROM drive 253. Cage 203 further includes a rotating magnetic hard disk drive, which is not visible. Right cage 204 similarly includes processor cards 242, memory cards 244, I/O cards 246, diskette drive 252, CD ROM drive 254, and hard disk drive (not shown).

The rear side of drawer, visible in FIG. 2B, includes right and left I/O communication modules 209–212. I/O modules 209–212 communicate with one or more host computer systems over a local area network or other medium, and/or communicate with storage devices located in drawers 104–107, handling the transfer of data between drawer 102 and the storage devices. I/O modules 209–212 may optionally communicate with additional storage devices located in drawers in adjacent racks (not shown). Data communication cables (not shown) exit the rear of modules 209–212 to connect the modules with their respective hosts, storage devices, or other devices.

Drawer 102 further includes reserved spaces for later system enhancements, depicted in FIGS. 2A and 2B as modules 205–208 and 213–216. Modules 213–216 are intended as additional I/O communications modules, similar in function to modules 209–212. Modules 205 and 206 are intended as optional performance enhancement modules, which may include cache and other logic to increase the performance of the storage subsystem. Modules 207 and 208 are intended as additional non-volatile random access memory (NV RAM), which temporarily store data bound for storage devices located in storage drawers 104–107. Modules 205–208 and 213–216 are shown in FIGS. 2A and 2B although in fact they are not supported by the backplane card design of the preferred embodiment. Support for these modules may require modifications to backplane sections 220 and 221 so that the backplanes would mount connectors supplying power and data signals to the modules.

Modules are electrically connected to one another for distribution of power and data signals by means of a three-part system backplane, comprising left backplane circuit card section 220, right backplane circuit card section 221, and backplane jumper card section 222. As used herein, the term "module" includes any electronic subassembly, such as circuit cards and card cages, as well as fully enclosed modules that are pluggable into any of the backplane sections 220, 221, 222. Left section 220 and right section 221 are similar, and provide essentially duplicative function, i.e., left section 220 couples the various modules located on the left side of drawer 102, providing power to the modules and permitting data to flow between modules. Right section accomplishes the analogous task for the modules on the right side of drawer 102. Jumper section 222 is smaller than either section 220 or 221. Jumper 222 electrically connects the other two sections, allowing signals to pass between them and distributing power, and provides grounding connections, as explained further herein. Dividing the backplane into two separate sections linked by a jumper, each having duplicative function, makes it possible to replace one of the backplane sections while the other continues to function. While it would have been possible (and generally cheaper) to provide a single larger backplane circuit card, the three part design enhances the concurrent maintenance capability of the system.

The two functional halves of electronics drawer 102 are capable of independent operation, although they are linked by a data communication path across jumper 222. Each half has its own independent connection with a host system, so that each half can independently receive or transmit data from the host. Each has its own independent power. Each has its own independent bus connection to the storage devices. Preferably, the storage devices buses are configured as inherently redundant loops using IBMs Serial Storage Architecture, each bus being coupled to bus interfaces in both halves of electronics drawer 102, so that either half of the drawer can access any arbitrary storage device. Finally, each half of drawer 102 has its own processor and memory for processing commands from a host, issuing commands to storage devices, transmitting and caching data, performing parity or other error correction and detection calculations, performing error recovery and diagnostics, and other subsystem functions. In normal operating mode, storage access requests from a host will be allocated between the two halves based on the storage device accessed, address range, or other criteria, so that ideally each half is doing roughly equal work. Each half will thus independently handle a portion of the data access. The communications path between halves may be used for cache coherency, parity calculations, status information, diagnostics, etc. In the event any half of drawer 102 is non-functional for any reason, the remaining half will handle all data access requests from the host to any storage device. Because there will only be one processor and associated hardware to handle all storage access requests (where there are normally two), this may result in lowered performance. However, the system will remain operational.

Figure 3A:
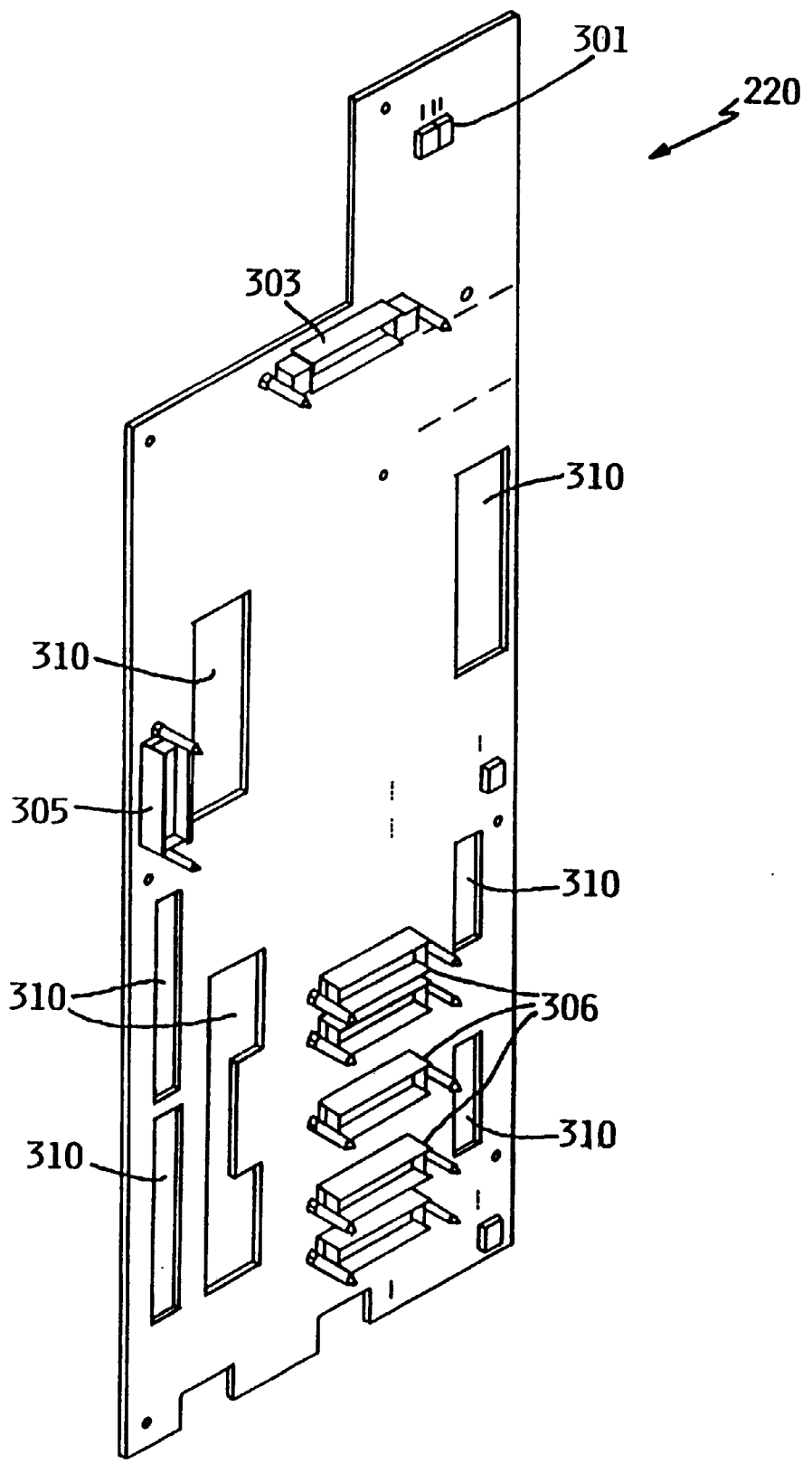
FIGS. 3A and 3B are isometric perspective views of the left section backplane circuit card according to the preferred embodiment.
Figure 3B:
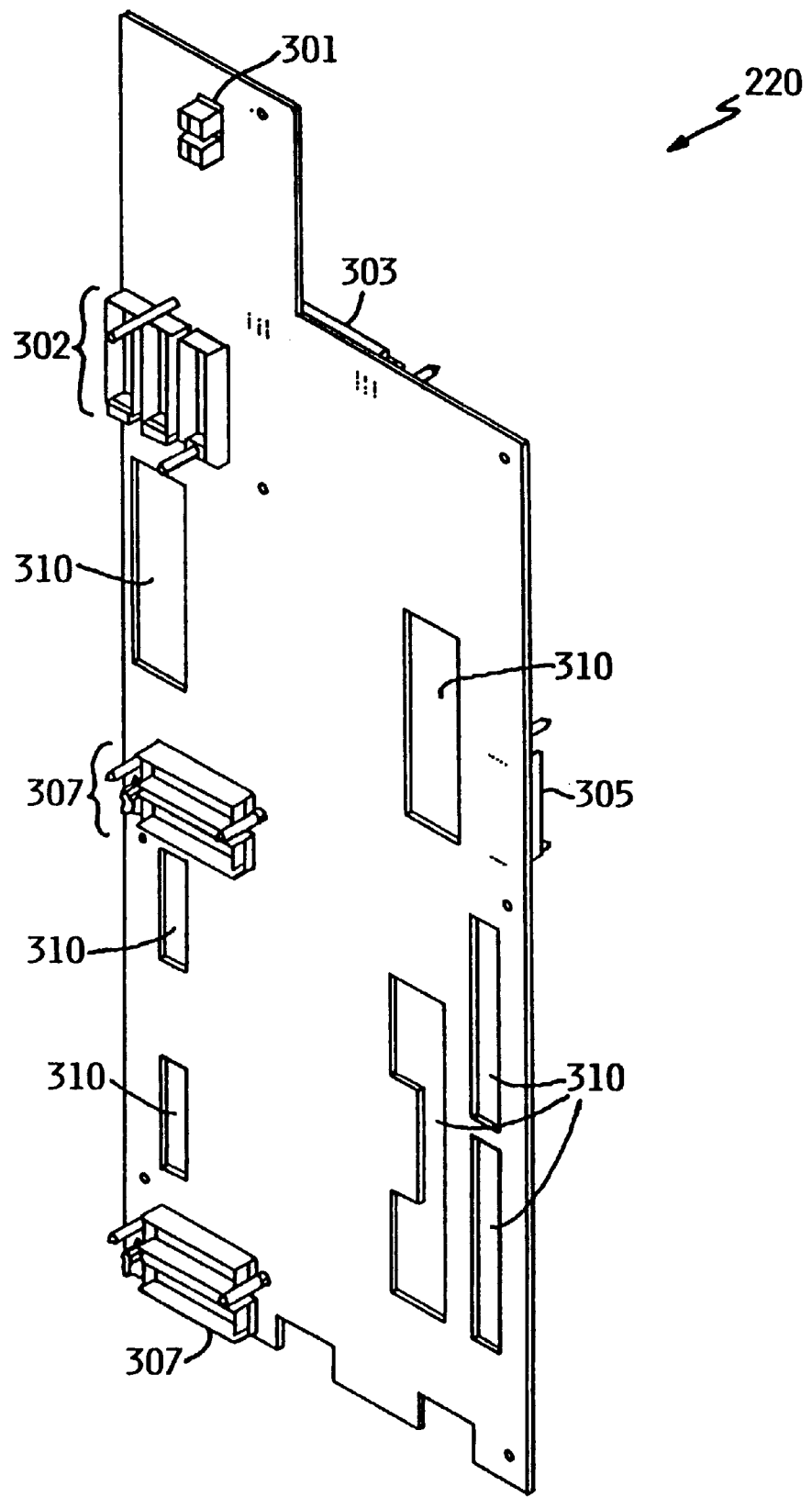

FIGS. 3A and 3B are perspective views of left section backplane circuit card 220 according to the preferred embodiment. FIG. 3A shows the front side of card 220, while FIG. 3B shows the back side. On the back side and near the top of card 220 can be seen a pair of power connectors 301. Beneath power connectors 301 is a set of three signal connectors 302. Power connectors 301 and signal connectors 302 mate with corresponding connectors on jumper card 222 shown in FIGS. 2a and 2b to form the connection with the jumper card. Additional connectors mate with corresponding connectors on the various modules. Specifically, power supply connectors 303 mate with left power supply 201; card cage connectors 305 mate with connectors of a power supply (not visible) in left card cage 203 which provides power at working voltages and status information for main processor cards 241, memory cards 243, various I/O cards 245, etc.; I/O card connectors 306 mate with connectors in card cage 203 for the various I/O cards 245; and I/O module connectors 307 mate with the left I/O adapter modules 211 and 212. Embedded signal lines are formed in a plurality of conductive planes in circuit card 220, running between the various connectors. Holes 310 in card 220 allow cooling air to pass through the backplane.

Figure 4A:
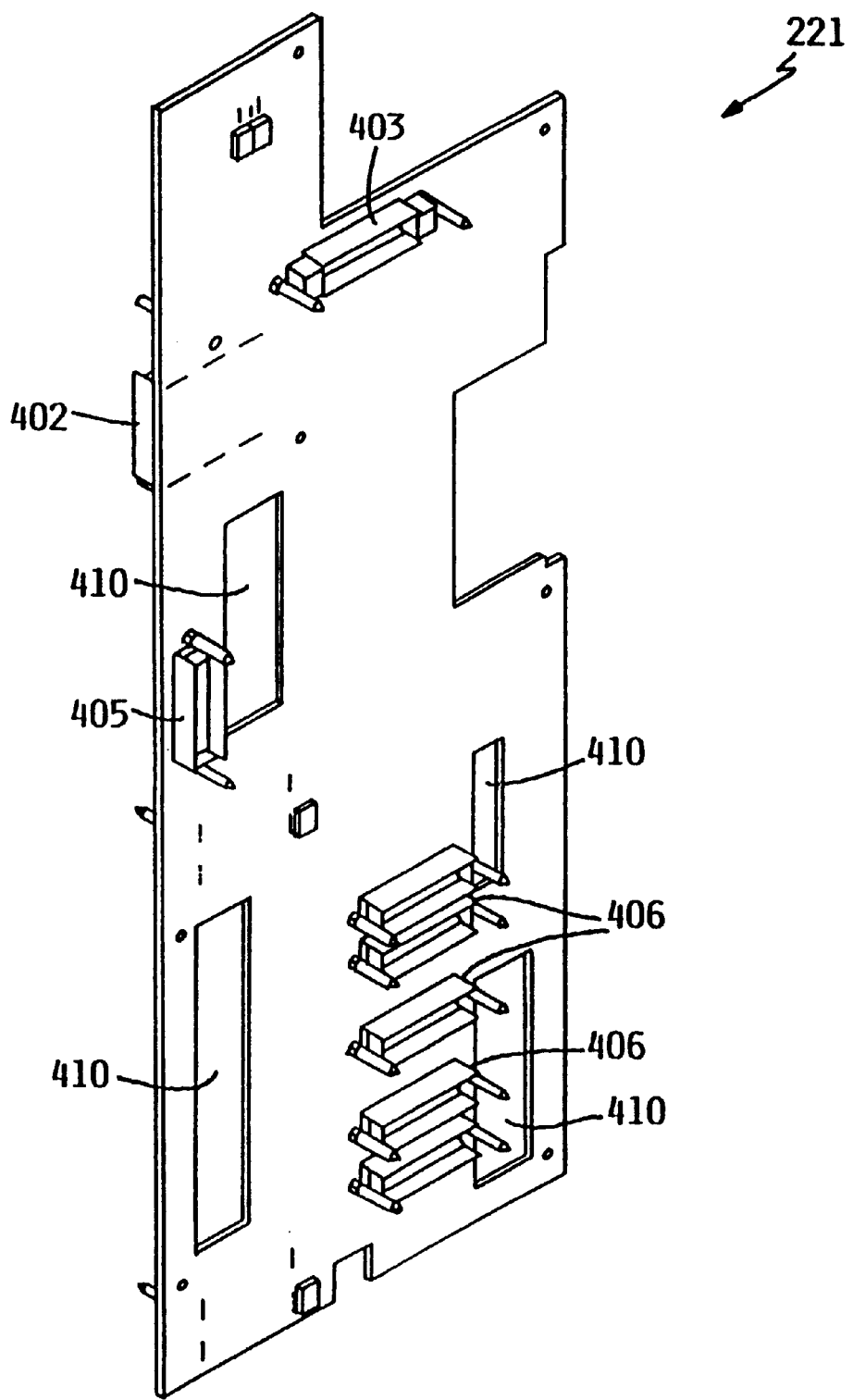
FIGS. 4A and 4B are isometric perspective views of the right section backplane circuit card according to the preferred embodiment.
Figure 4B:
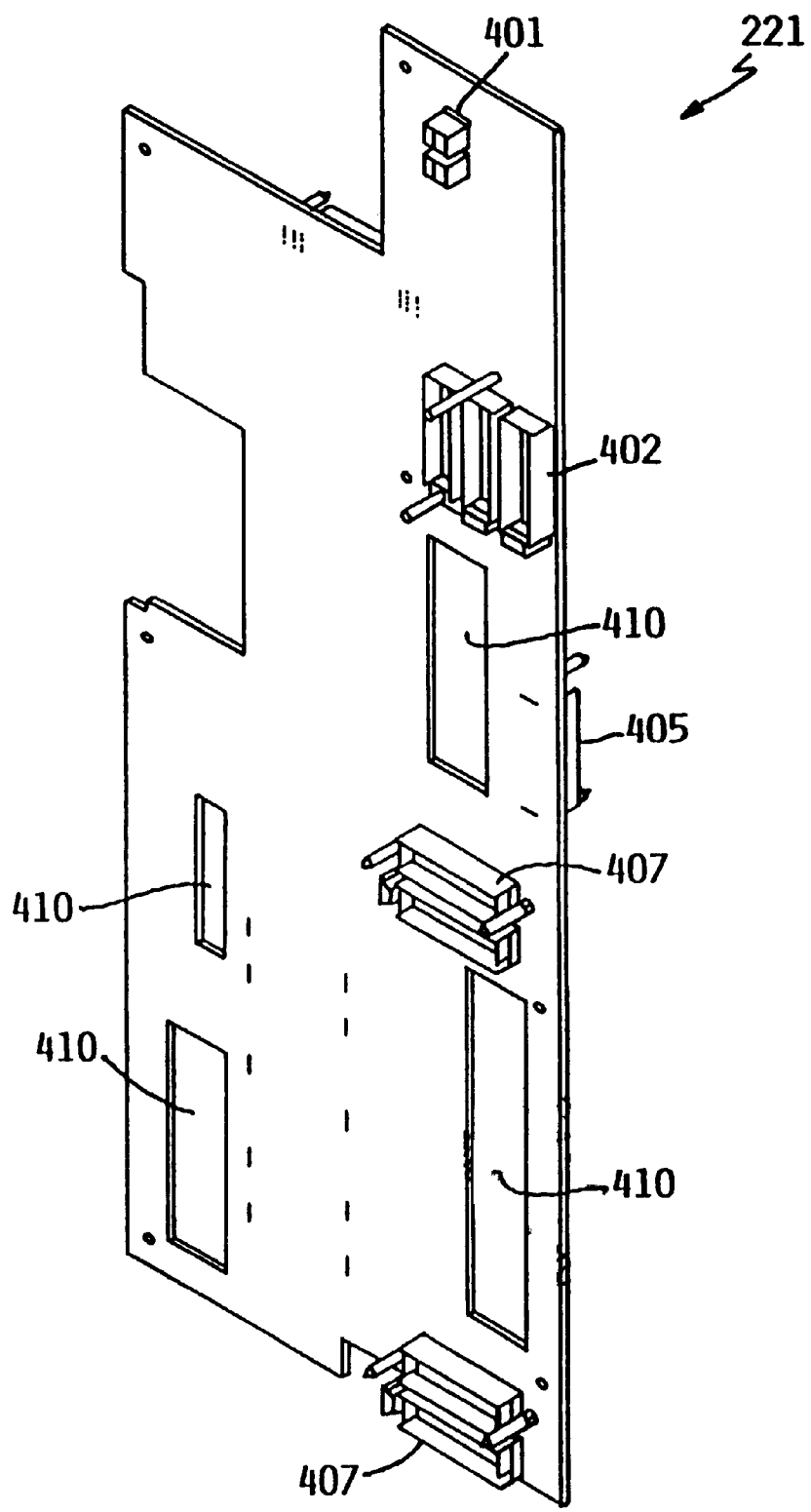

FIGS. 4A and 4B are perspective views of the right section of backplane circuit card 221. Circuit card 221 is generally similar in construction and function to card 220. FIG. 4A shows the front side of card 221, while FIG. 4B shows the back side. Power connectors 401 and signal connectors 402 form connections to connectors (not shown) of jumper card 222, similarly to left section card 220. Power supply connectors 403 mate with right power supply 202; card cage connectors 405 mate with connectors of a power supply (not visible) in right card cage 204 which provides power at working voltages and status information for main processor cards 242, memory cards 244, various I/O cards 246, etc.; I/O card connectors 406 mate with connectors in card cage 204 for the various I/O cards 246; and I/O module connectors 407 mate with right I/O adapter modules 209 and 210. Embedded signal lines are formed in a plurality of conductive planes in circuit card 221, running between the various connectors. Holes 410 permit the passage of cooling air.

FIGS. 5a, 5b, 5c, and 5d are different perspectives of a robust connector system 50 having a female connector 500 and a male connector 600 that will tolerate arcing on connectors pins. Robust connector system can be used, for example, in power connections 303, 305 and I/O card and module connectors 306 and 307, respectively, as shown in FIGS. 3a and 3b, as well as in power connectors 403, 405 and I/O card and module connectors 406 and 407, respectively, shown in FIGS. 4a and 4b. It is also contemplated that the robust connector assembly may be used in signal connectors 302 and 402. In the preferred embodiment of the invention, the male connector 600 is installed at the connectors on the backplanes 220 and 221 whereas the female connector 500 is installed in the pluggable modules, although the arrangement could be reversed easily, i.e., with the female connectors 500 installed on the backplane and the male connectors installed into the pluggable modules.

Figure 5B:
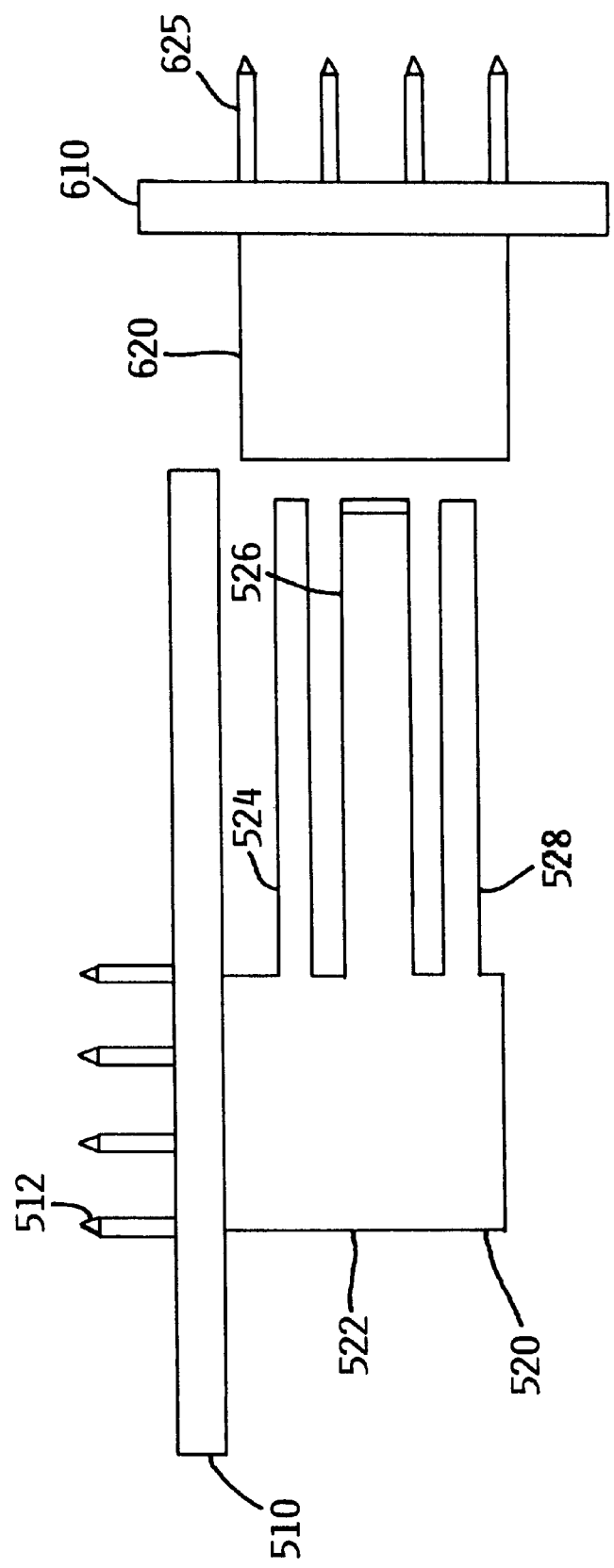
Figure 5C:
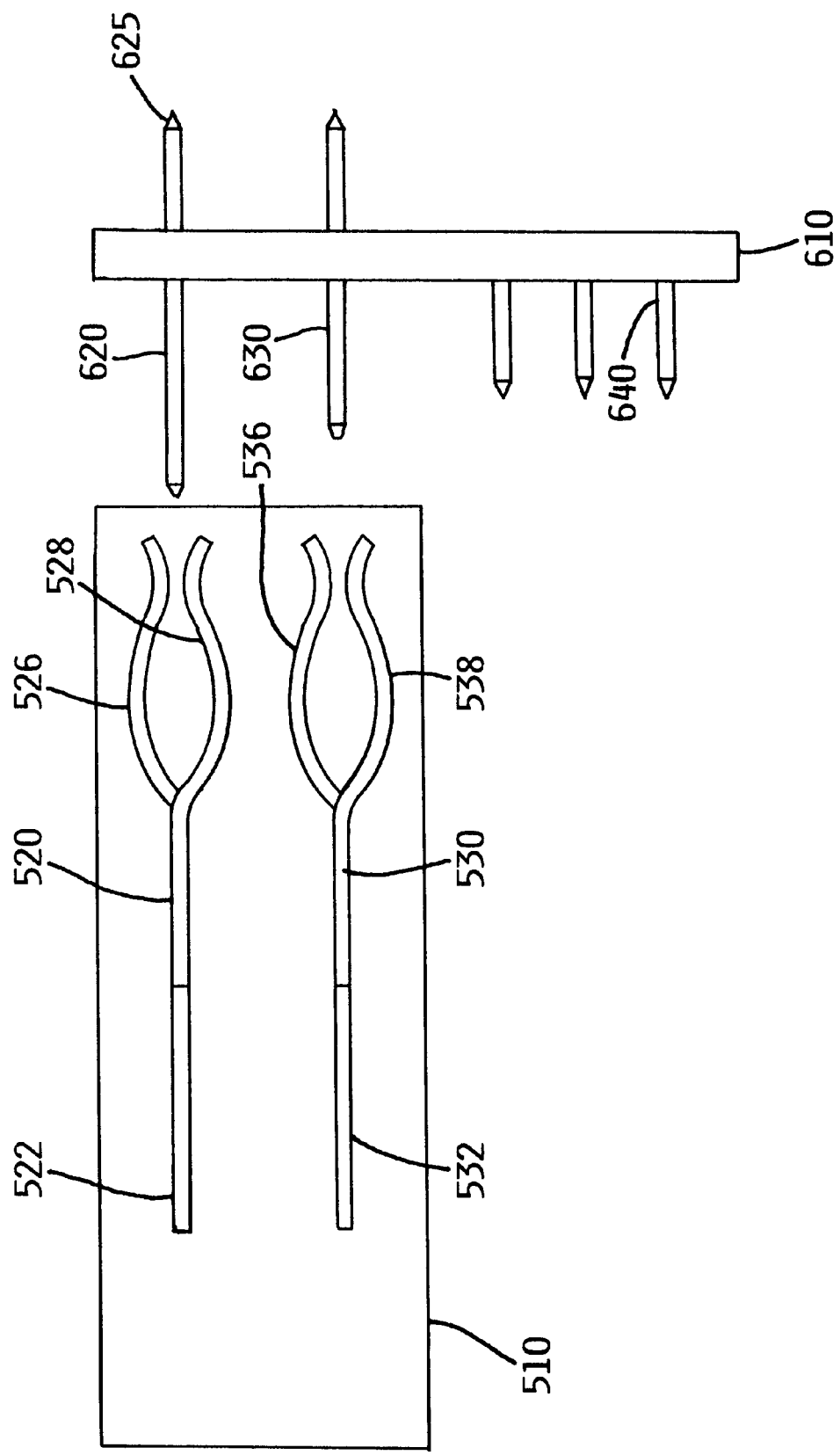
Figure 5D:
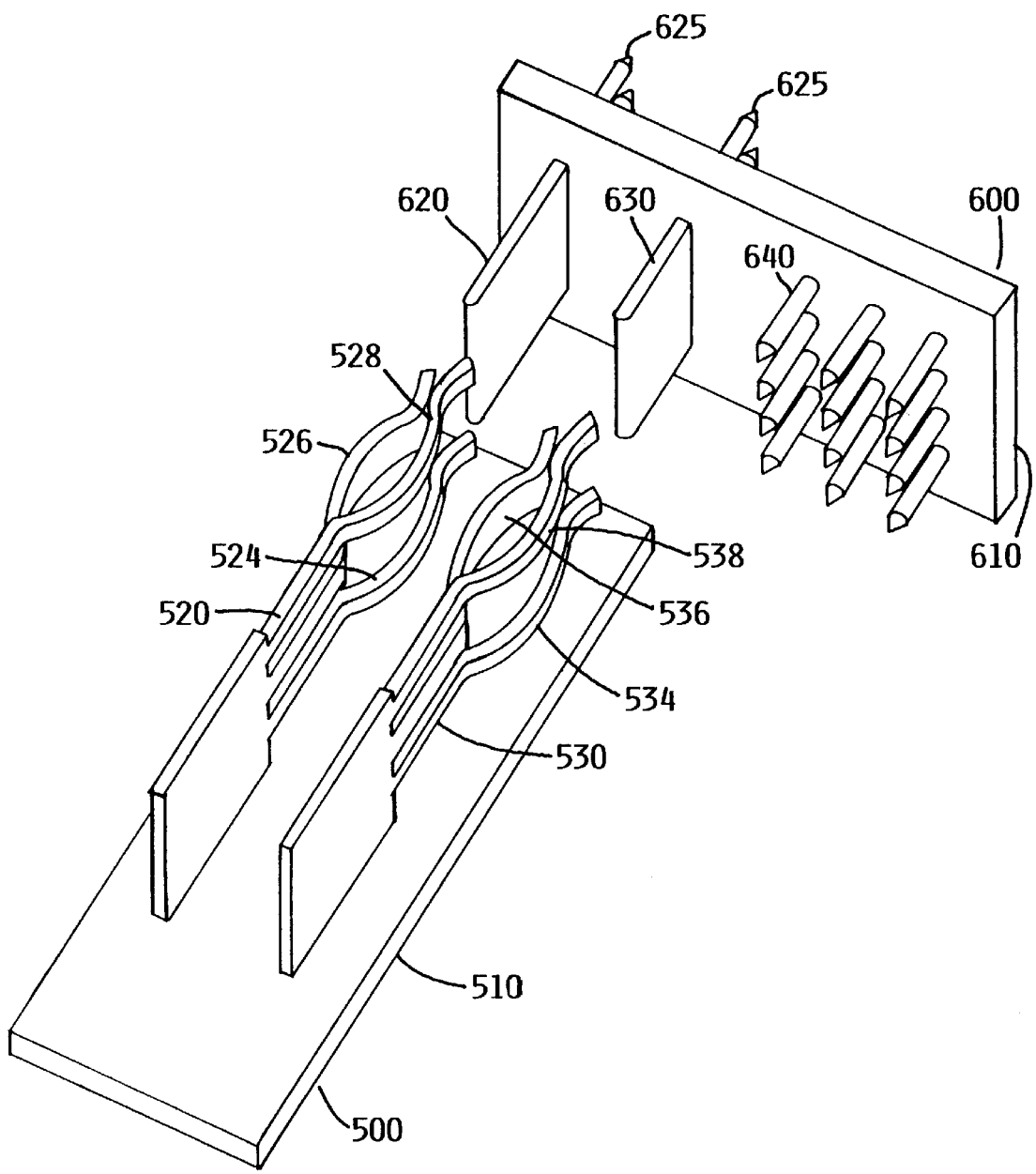
FIG. 5d is a perspective view of a male and female pluggable connectors to be mated in accordance with principles of the invention.
Figure 6A:
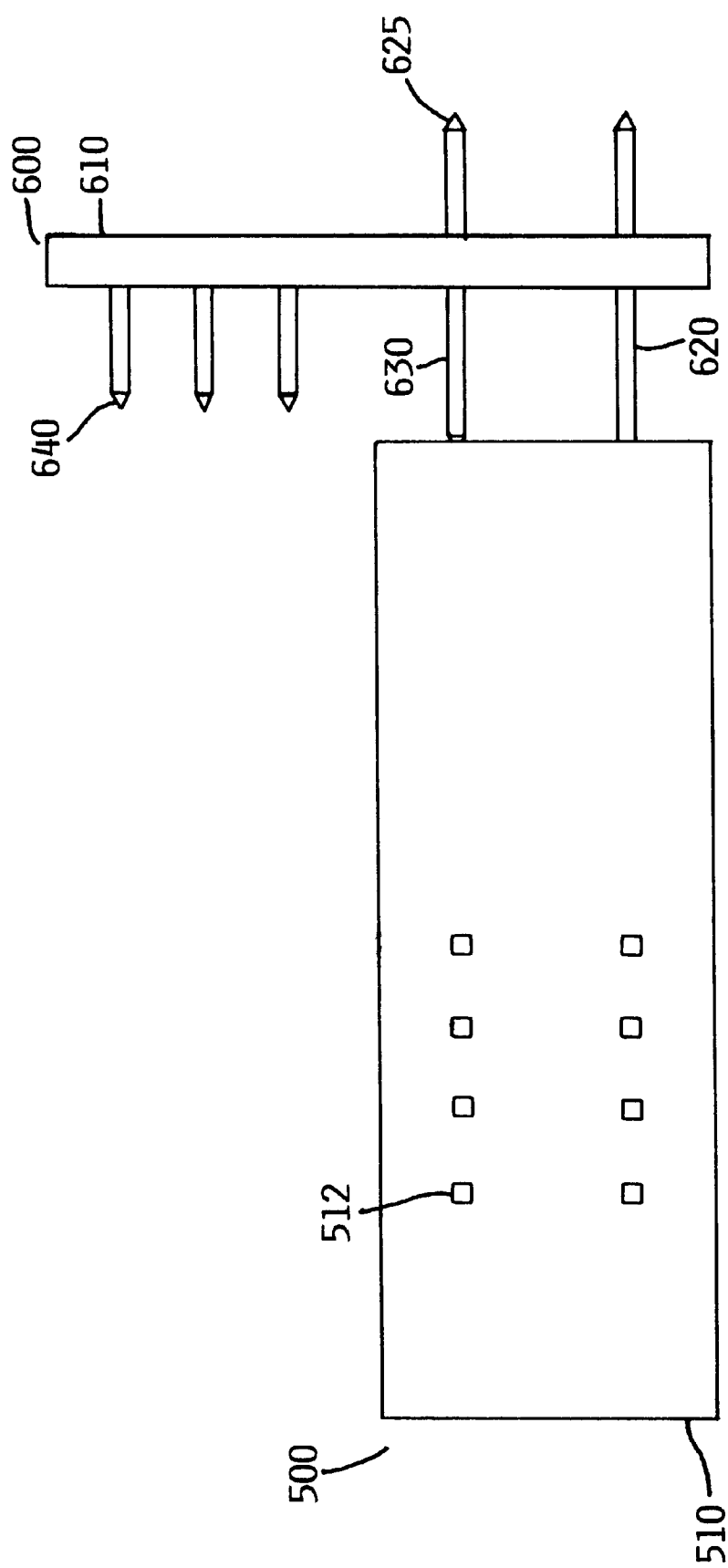
FIGS. 6a, 6b, and 6c are plan views.
Figure 6B:
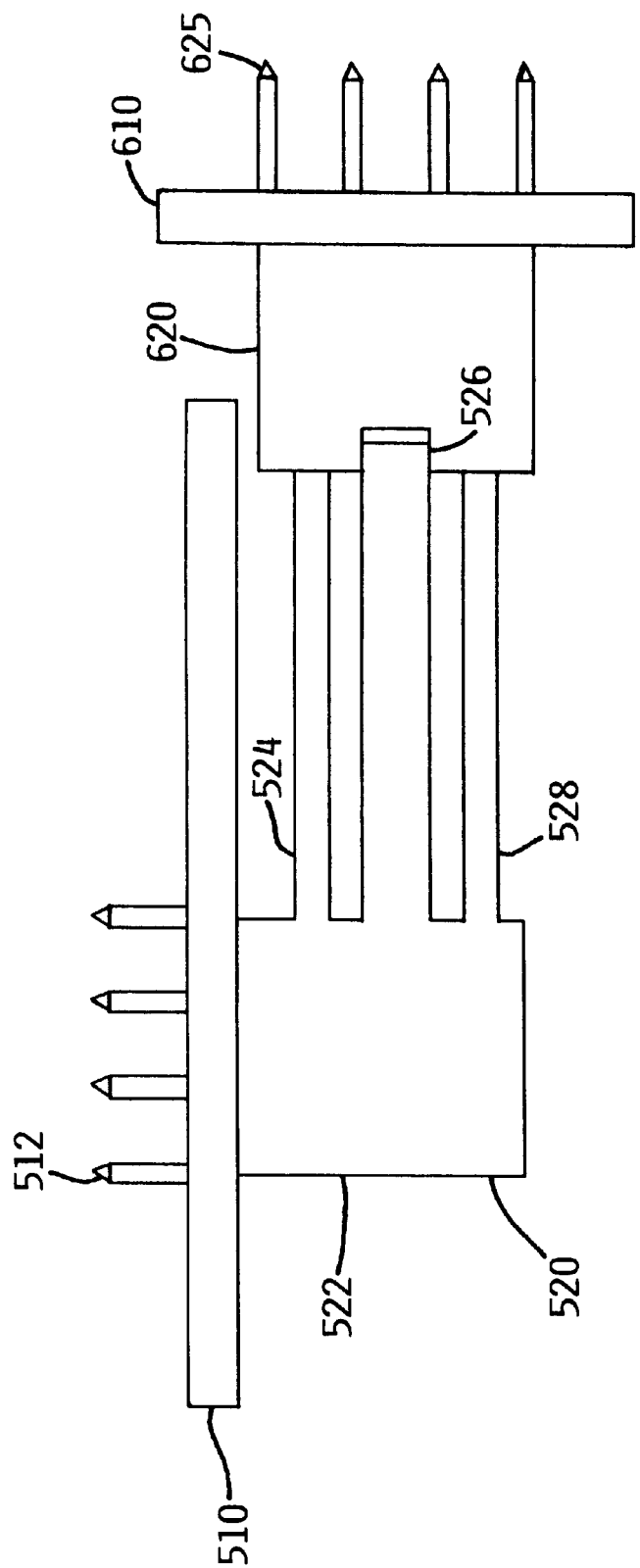
Figure 6C:
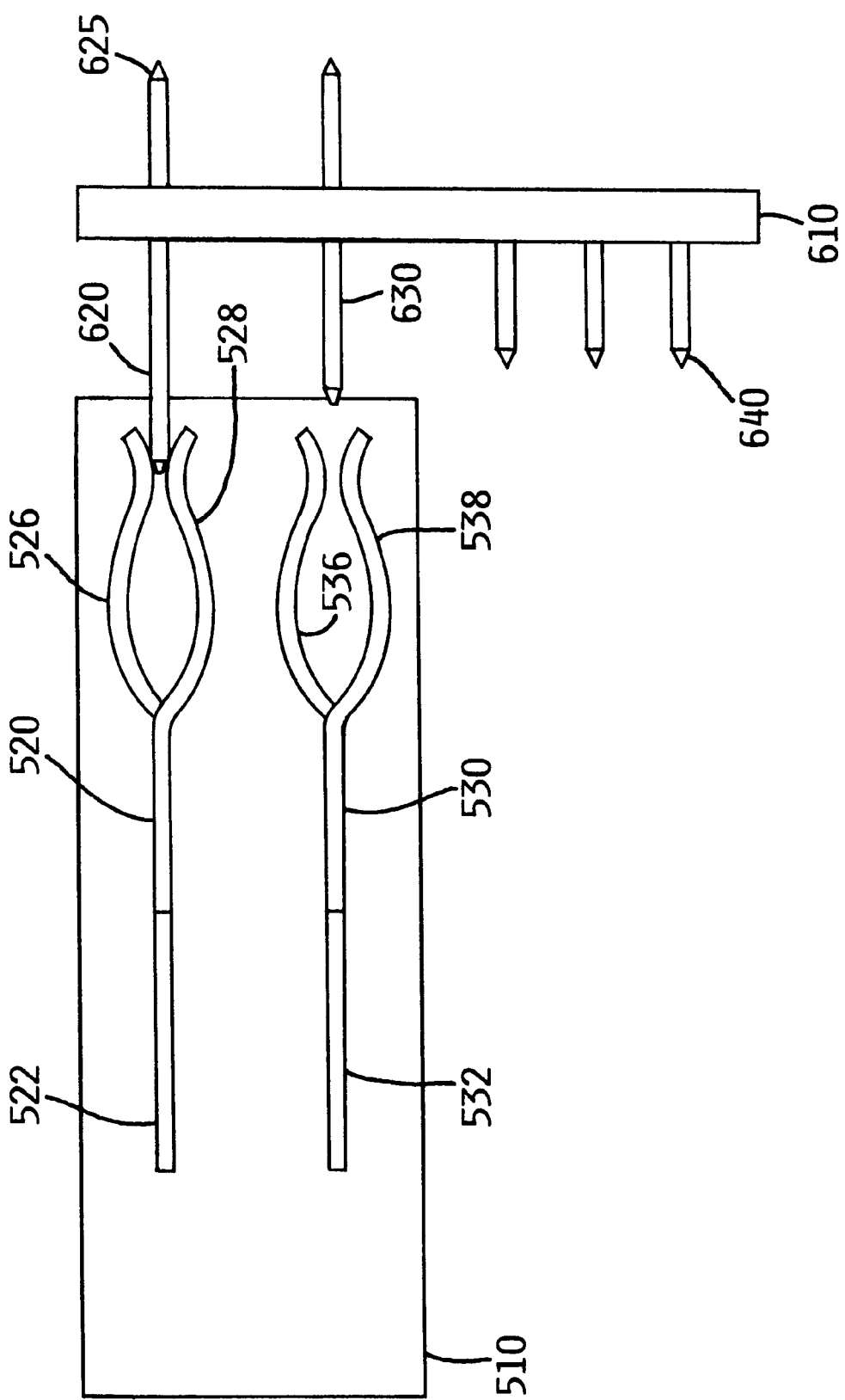
Figure 6D:
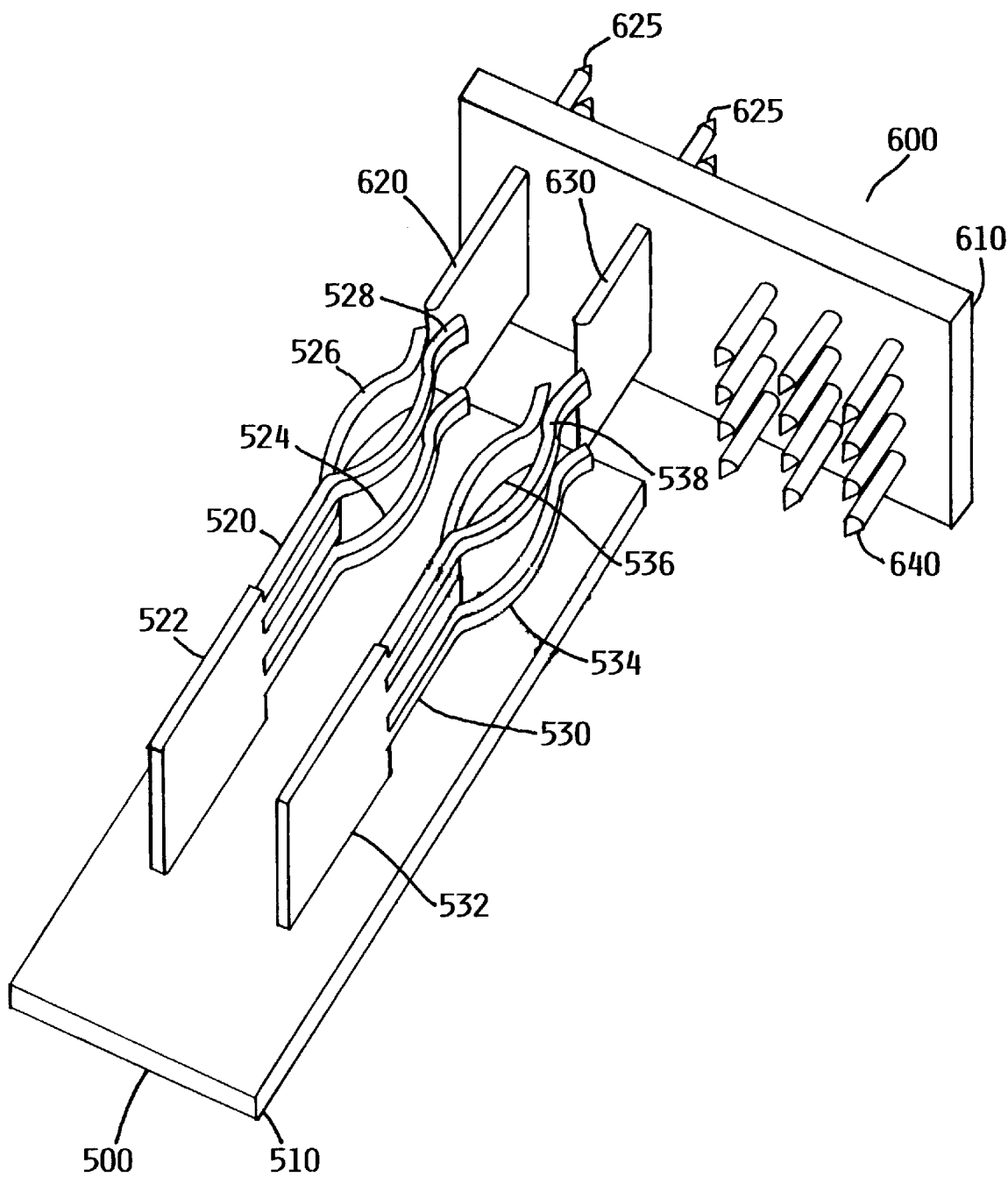
FIG. 6d is a perspective view of a male and female pluggable connectors making contact in accordance with principles of the invention.

FIG. 5a is plan view of the female connector 500 near the male connector 600. Typically, both the female connector 500 and the male connector 600 are contained in a plastic or nonconductive housing which is not shown for ease of illustrating the principles of the invention. Female connector 500 has a nonconductive planar base 510, typically a circuit board, with a plurality of connector pins 512 extending perpendicularly from it. Connector pins 512 may conduct electrical power to a pluggable module (not shown) with which the pins would be in intimate contact on a circuit card assembly or other power transfer circuit in the pluggable module (not shown) connected to the base 510 by means of, for example, welding, bump connections, etc. as is known in the art. As shown in FIG. 5b, on the opposite side of the base 510 from the pin connectors 512 is a female connector assembly 520 comprising two solid conductive metal pieces, 522 and 532, only one of which is shown in FIG. 5b. The solid conductive metal piece 522 which may be a metal plated with gold, tin, or paladium-nickel separates into three curved extensions 524, 526, 528 which form the redundant connecting surfaces of the female connector assembly 520. As can be seen from the plan view of FIG. 5b and the perspective view of FIG. 5d, the center extension 526 is wider across the vertical dimension than the other two extensions 524 and 528. Extensions 524 and 528 are complementarily curved extending away from the center extension 526 and then curve back towards it to squeeze the receiving connectors blades 620 and 630 of the male connector 600. A second female connector assembly 530 of similar construction and material is also provided on the female base plate 520. Although only one female connector assembly 520 has been described and though only two 520, 530 are shown in the figures, it is to be undersood that other such assemblies can be included on the base plate 520. The placement of the female connector assemblies 520, 530, moreover, may vary from what is shown in the figures, i.e., the do not necessarily have to be adjacent to one another as shown, but can be separated.

Male connector assembly 600 also has a nonconductive base plate 610 with conductive signal connector pins 640 extending through the base plate 610, typically a printed circuit board. Male connector assembly 600 also has connector blades 620 and 630 made from a conductive material, which may be, for example, a conductive metal with gold or tin or paladium-nickel plating. Connector blades 620 and 630 also extend through the base plate 610 and have typical electrical connections 625 on the backside. Connectors blades are a preferred structure over connector pins to ensure contact with the redundant surfaces 524, 526, 528 and 534, 536, 538 on the female connector assemblies 520 and 530, respectively. Connector blades 620 and 630 are made to fit through the narrowing of the female connector extensions 524–528 and 534–538, respectively, with extension 526 on one side of connector blade 620 and extensions 524 and 528 on the other side of the connector blade 620 to make electrical contact. Similarly connector blade 630 meets and mates with extensions 534 and 538 on one side and with extension 536 on the opposition sides. Fully mated male and female connectors are shown in FIGS. 8a, 8b, 8c, and 8d.

Figure 7B:
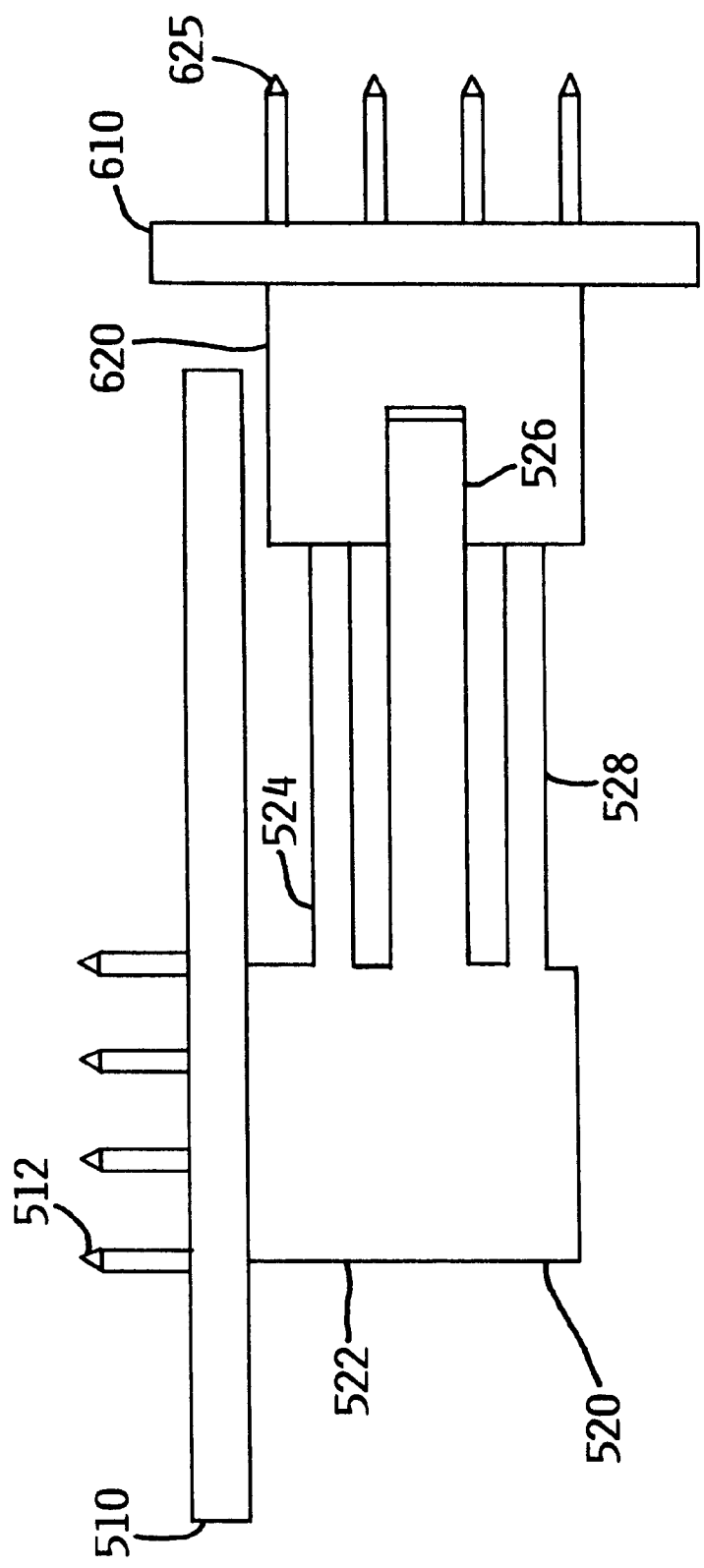
Figure 7C:
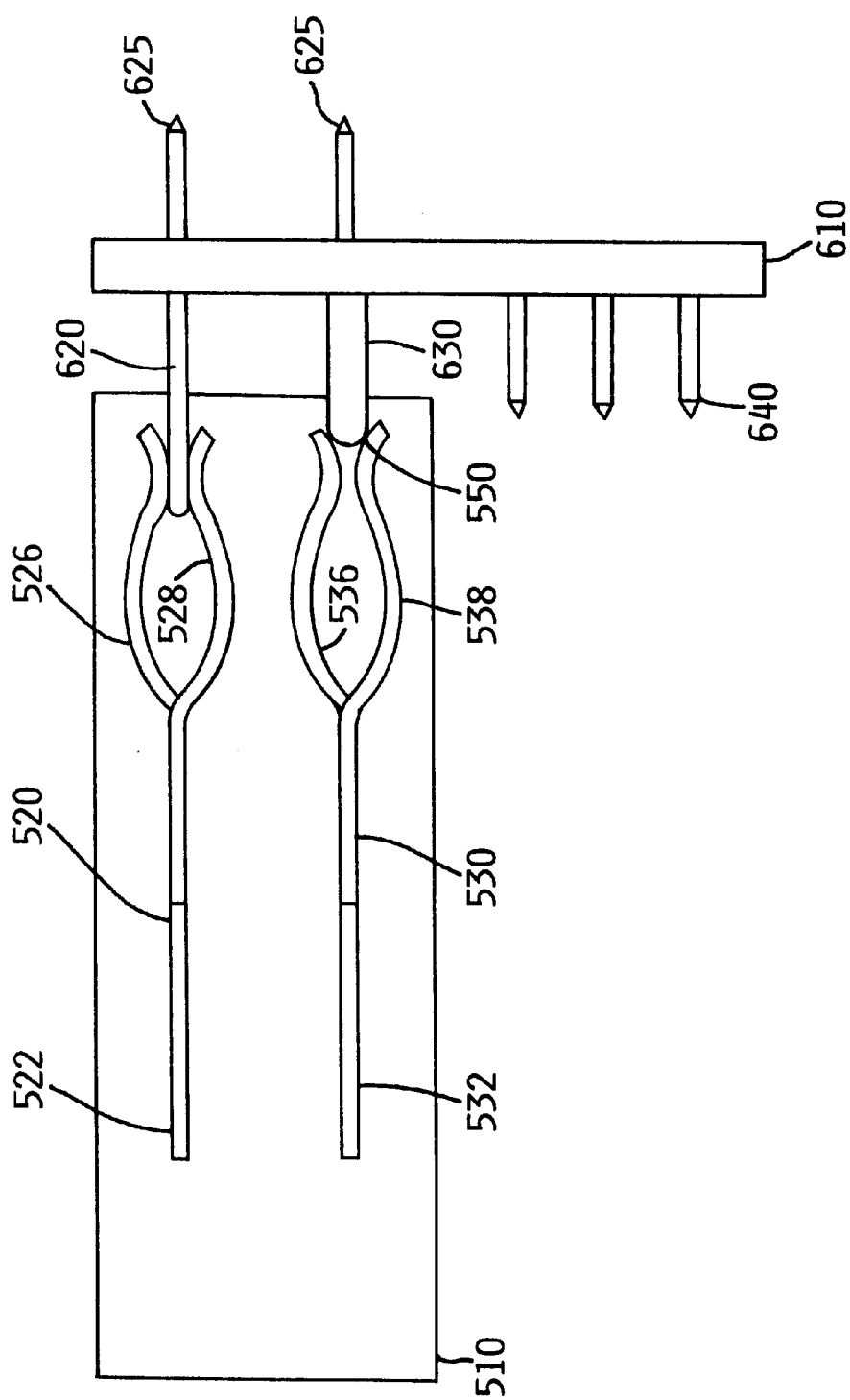
Figure 7D:
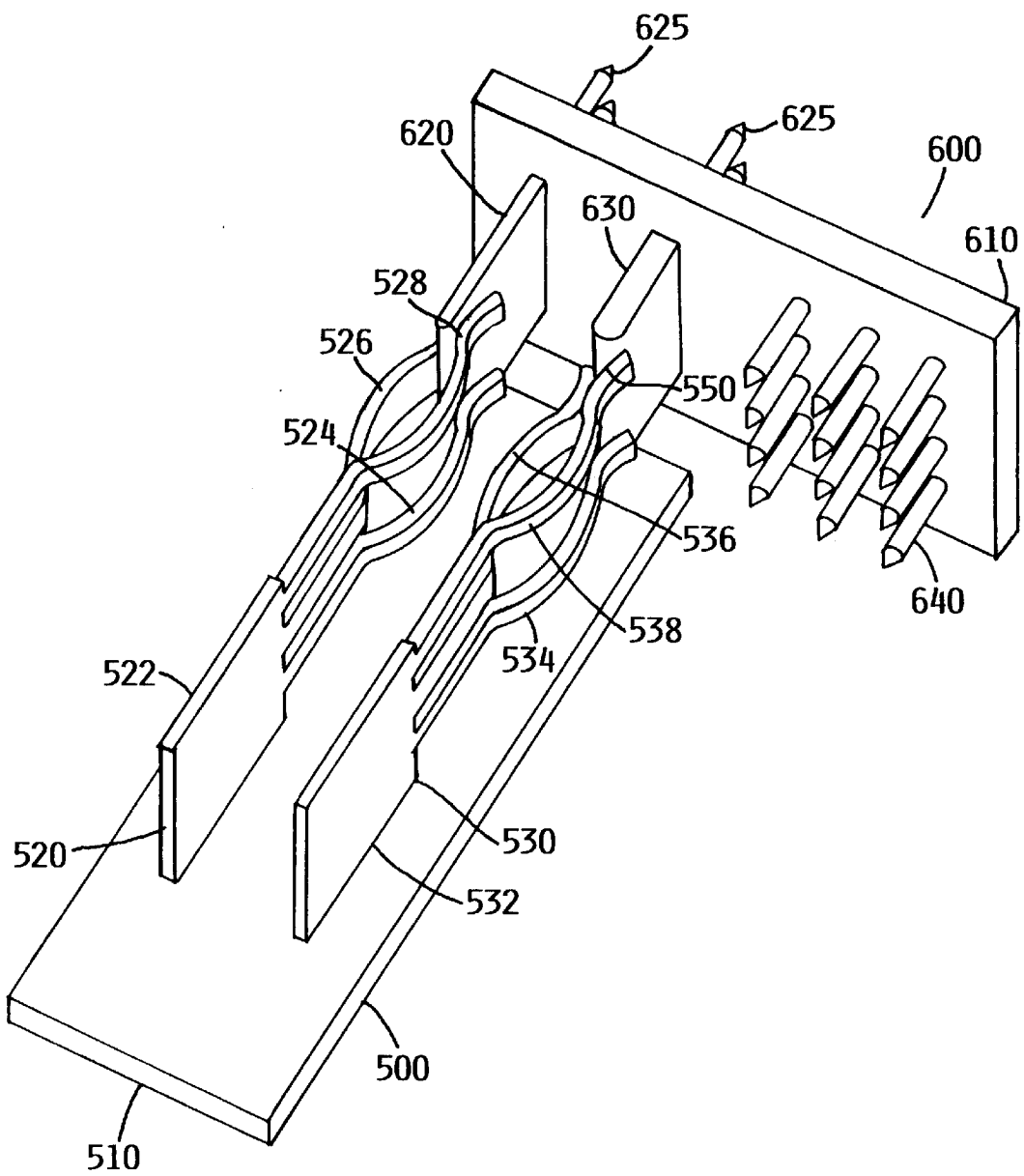
FIG. 7d is a perspective view of a male and female pluggable connectors making further contact in accordance with principles of the invention.
Figure 8A:
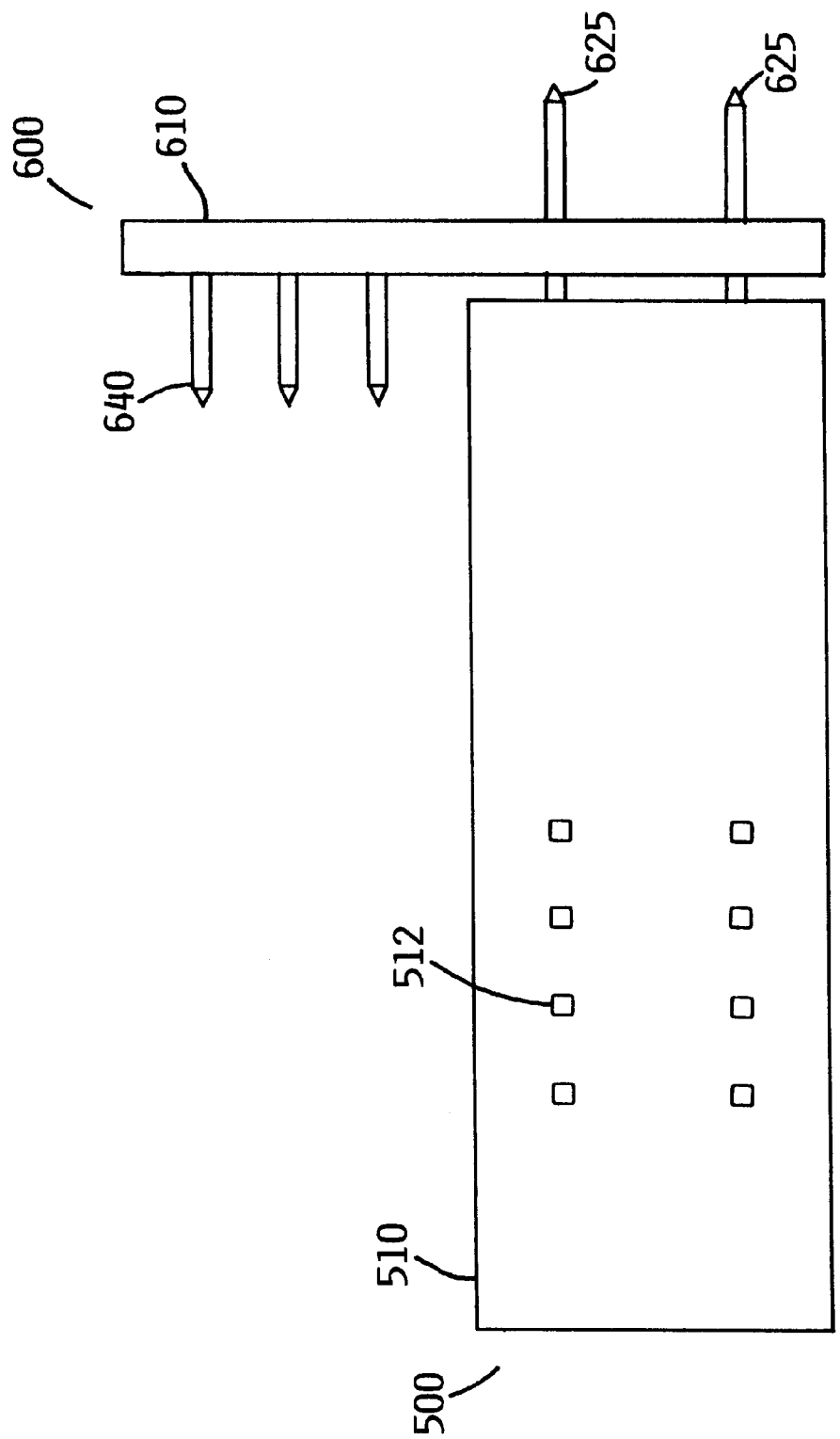
FIGS. 8a, 8b, and 8c are plan views.
Figure 8B:
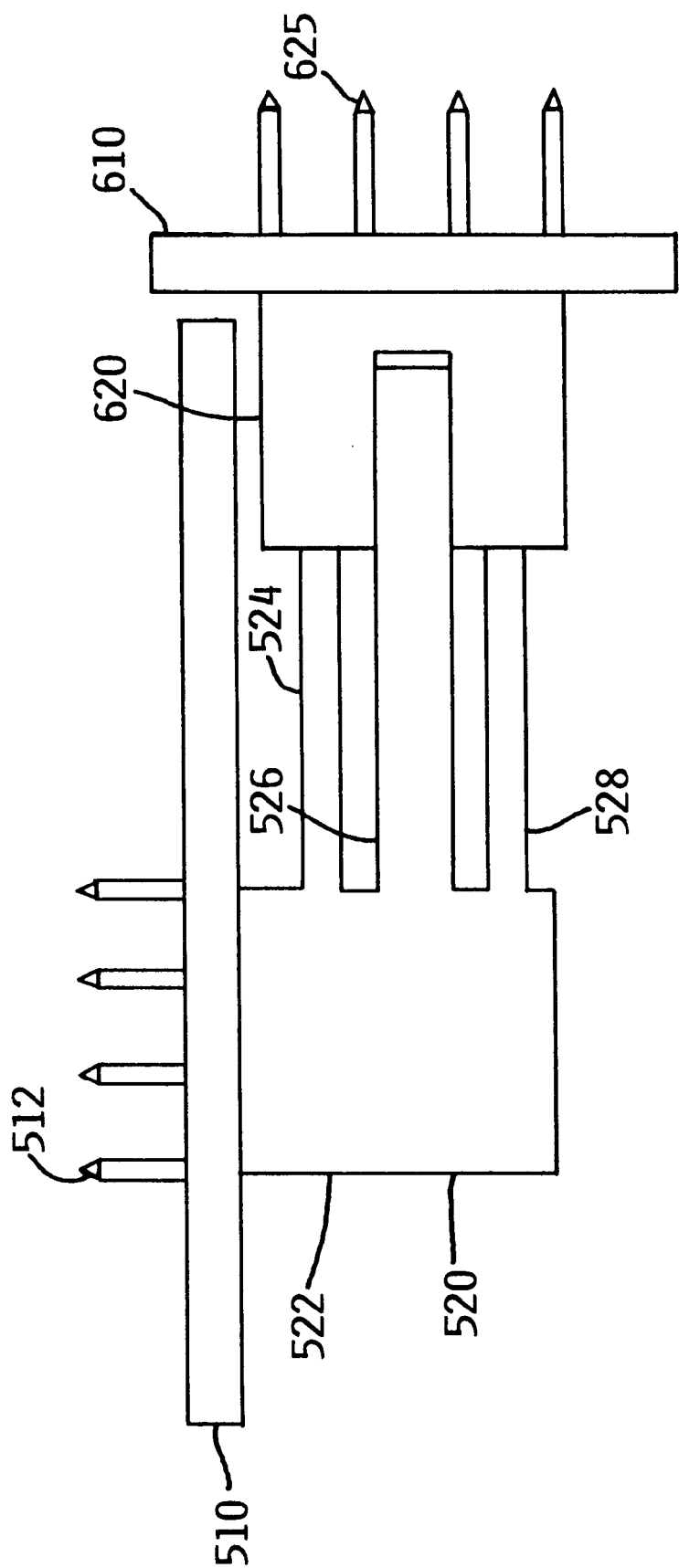
Figure 8C:
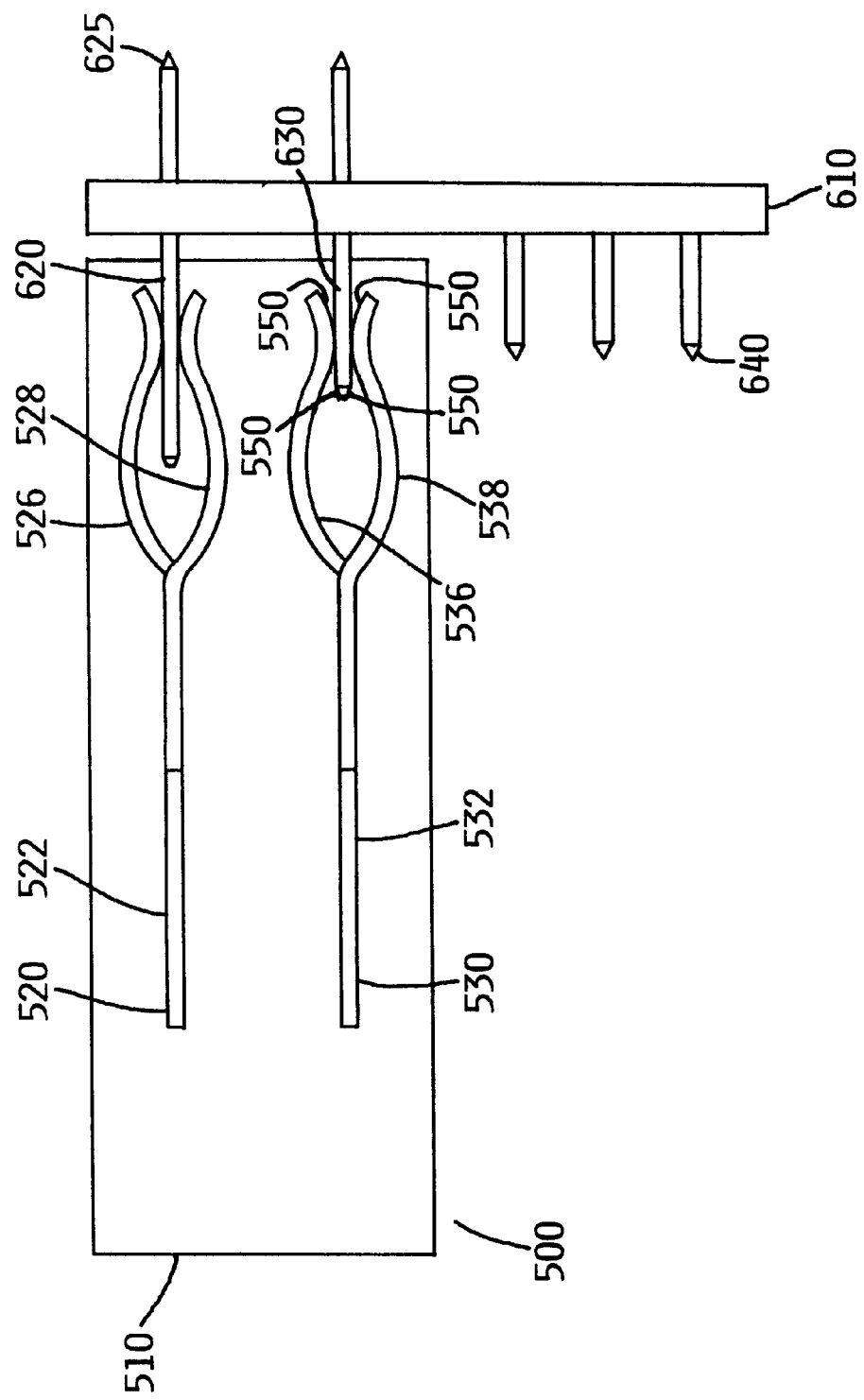
Figure 8D:
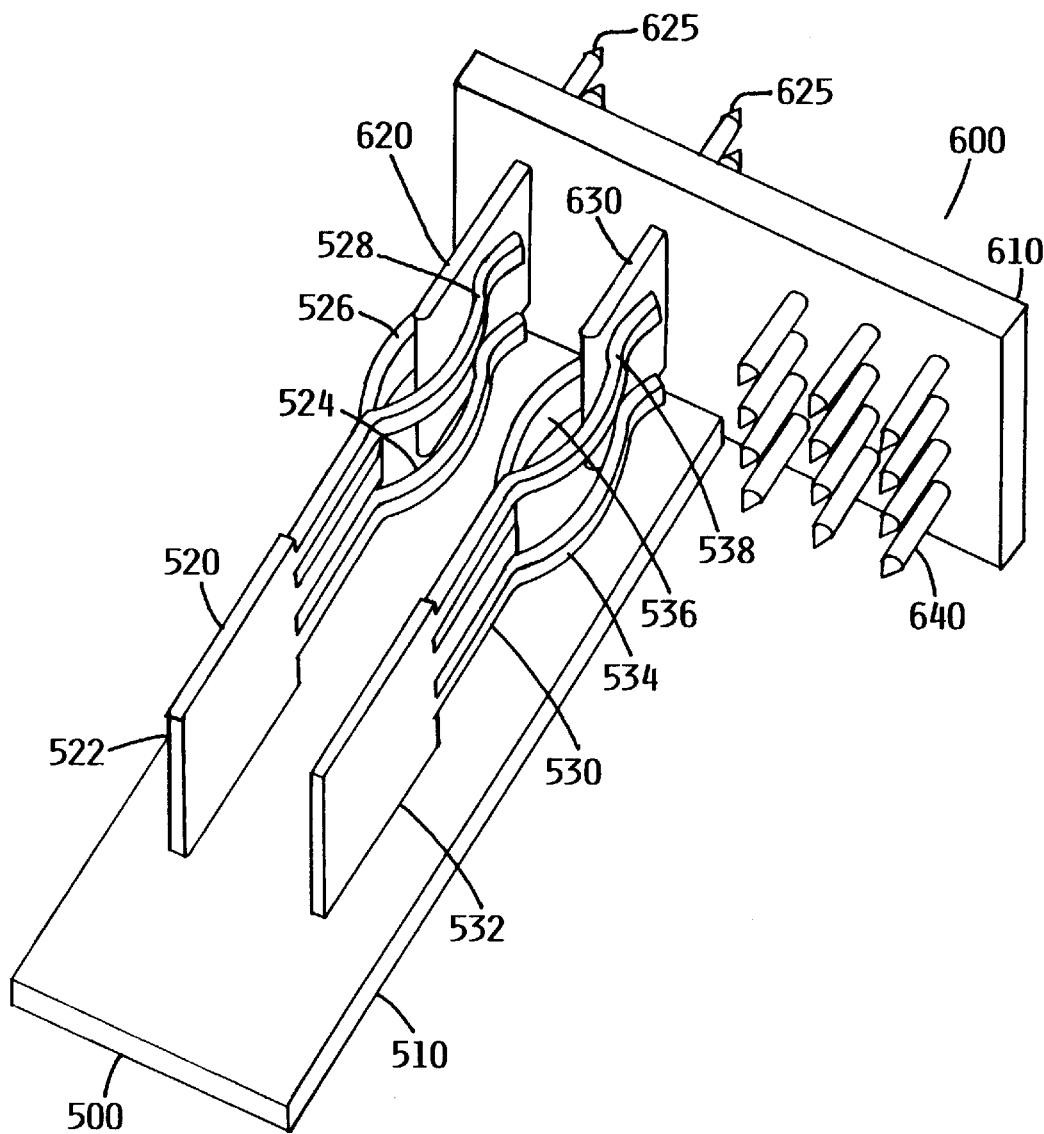
FIG. 8d is a perspective view of a male and female pluggable connectors fully mated in accordance with principles of the invention.

The previous paradigm of electrical connectors has been to avoid arcing as discussed earlier. The paradigm of the invention described herein is accept arcing when the electrical connection is made by providing redundant surfaces on electrical connectors which tolerate any resultant damage and which are significantly over-rated for the actual current and voltage spikes occurring during the plugging process. The process of plugging the connectors together will now be described with respect of FIGS. 6, 7, and 8.

In FIGS. 6a, 6b, 6c, and 6d, the male connector 600 and the female connector 500 move closer to each other and the longest connector blade 620 meets the female connector assembly 520 to be inserted between extensions 524 and 528 on one side of the connector blade 620 and spring extension 526 on the other side. Typically, this first connection is to ground the male connector 600 to the grounded contact on the female connector 500. When the first contact is to ground, the circuit is not complete and no arcing has occurred yet.

In FIGS. 7a, 7b, 7c and 7d, the long connector blade 620 is squeezed and further inserted between the extensions 524, 526, 528 of the first female connector assembly 520, typically connected to ground. At this point, the shorter connector blade 630 of the male connector 600 makes its first point of contact with extensions 534, 536, 538 of the second female connector assembly 530 as described with respect to the connection between the ground connector blade 620 and the female connector assembly 520. If the second female connector 530 is connected through its pin connectors 512 to the power grid on the backplane (not shown), the power circuit through the male connector 600 to the female connector 500 and its attached module (also not shown) is complete. At this time an arc occurs because of the presence of voltage, the unlimited current path, and the discharged input capacitance. The rendering of the connector blade 630 in FIG. 7c has been widened to dramatize the point of first contact where the arc occurs.

The arc occurs on a point 550 that is the first contact point between the male connector 600 and the female connector 500 and can damage both connectors. The damage resulting from the arc can vary: it can be hardly noticeable, or the arcing can cause a sooty residue, or it can even burn through the plating and expose metals beneath the top plating material, etc. The amount of damage depends upon the voltage of the charged up circuit, the amount of current that is drawn on that contact point, and other factors. This damage is tolerated by the invention because of several features. First, both the female connector 500 and the male connector 600 are over-rated in terms of current carrying and voltage capacity. The connectors can carry up to ten or more times the actual current and voltage values being transferred. Second, the invention provides for redundant connecting surfaces. Additional surface area is provided by the redundant surfaces of extensions 534, 536, 538 to provide actual electrical contact between the two connectors. Third, even if the connectors are slightly damaged by arcing at the point of contact 550 between the power connector blade 630 and the receiving female connector assembly 530, the connectors continue to be plugged together, wiping past the point of initial contact 550 to the ultimate electrical contact area.

Shown in FIGS. 8a, 8b, 8c, and 8d, are the fully mated connectors. As the female connector 500 and the male connector 600 continue to be plugged together, the male connector blades 620 and 630 wipe past the first point of contact 550 to make an actual electrical connection further down the blades in a horizontal direction past the bend of the spring on the redundant surfaces of the female connector extensions 524–528 and 534–538. Actual electrical contact is made on undamaged connector surfaces. There is no need for concern of foreign material being in the mating surfaces of the ultimate connection point as a result of the arc because there are multiple contact surfaces which can, in fact, be redundant if sized appropriately.

Thus a robust electrical connection system has been provided for use in computer systems having pluggable modules, also called field replaceable units, in which the modules can be inserted and powered-on without interrupting power to the computer systems Arcing is tolerated by the robust electrical connection system because it is over-rated for the actual current values and voltages being transferred; the connectors have redundant surfaces so that actual electrical contact can occur at sites other than where any damage may have resulted from the arcing; and because the connector surfaces wipe beyond any point of initial contact damage to the ultimate point of electrical contact. Although a specific embodiment of the invention has been disclosed along with certain alternatives, it will be recognized by those skilled in the art that additional variations in form and detail may be made within the scope of the following claims:

What is claimed is:
1. An electronic system, comprising:
   (a) a frame for housing a plurality of electronic modules;
   (b) a backplane mounted to frame, said backplane having a plurality of circuits for power and signal distribution,
   (c) a plurality of electronic modules mounted to said frame and being pluggably coupled to said backplane; and
   (d) a plurality of electrical connectors significantly over-rated for a current and voltage capacity of said plurality of circuits for power and signal distribution, each of said plurality of electrical connectors further comprising:
      (i) a female connector mounted onto either said electronic module or said backplane, said female connector having a plurality of surfaces with which to provide electrical contact with at least one conductive connection of a corresponding male connector;
      (ii) said corresponding male connector mounted to either said backplane or said electronic module in a coupling arrangement with said female connector, said at least one conductive connection to contact at least one of said plurality of surfaces of said female connector,
   said female and said male connector allowing arcing to occur when said modules are being pluggably connected to said backplane while said backplane has current and voltage of said power and signals being distributed through said distribution circuits.

2. The electronic system of claim 1, wherein said arcing occurs when said at least one conductive connection of said male connector makes electrical contact with said plurality of surfaces of said female connector and said female connector and said male connector complete a power circuit from said backplane to said pluggable module.

3. The electronic system of claim 1, wherein said arcing occurs when said at least one conductive connection of said male connector makes electrical contact with said plurality of surfaces of said female connector and said female connector and said male connector complete a signal circuit from said backplane to said pluggable module.

4. The electronic system of claim 1, wherein one of said plurality of electrical connectors is a ground connection, and another of said plurality of electrical connectors is a power connection, and at least one a signal connection is provided for coupling between said backplane and said pluggable module, and the order in which connections are made is said ground connection being first, said power connection being second, and said at least one signal connections being third.

5. The electronic system of claim 1, wherein said plurality of electronic modules further comprise at least one power supply module to supply power to said backplane for distribution through said distribution circuits to other of said plurality of electronic modules.

6. An electronic system, comprising:

(a) a frame for housing a plurality of electronic modules;

(b) a backplane circuit card assembly mounted to said frame, said backplane circuit card assembly comprising a plurality of pluggable couplings;

(c) a plurality of electronic modules mounted to said frame for performing at least one function necessary for operation of said electronic system, each of said electronic modules being pluggably coupled to said backplane circuit card assembly; and (d) a plurality of electrical connectors significantly over-rated for a current and voltage capacity of said backplane, each of said plurality of electrical connectors further comprising:

(i) a female connector mounted onto either one of said plurality of electronic modules or said backplane, said female connector having a plurality of surfaces with which to provide electrical contact with at least one conductive connection of a corresponding male connector;

(ii) said corresponding male connector mounted to either said backplane or one of said plurality of electronic modules in a coupling arrangement with said female connector, said at least one conductive connection to contact at least one of said plurality of surfaces of said female connector, said female and said male connector allowing arcing to occur when one of said plurality of electronic modules are being pluggably connected to said backplane or being removed from said backplane while said electronic system remains operational.

7. A method of hot-plugging field replaceable units into a computer system, comprising:

(a) providing power to a backplane of said computer system for power and signal distribution, said backplane having at least a first electrical connector being over-rated for the voltage and current values of power and signals through said backplane;

(b) providing a field replaceable unit having a second electrical connector being over-rated for said voltage and current of power and signals through said field replaceable unit and said backplane, said second electrical connector to couple with said first electrical connector;

(c) establishing a ground electrical path between said first electrical connector of said backplane and said second electrical connector of said field replaceable unit while said backplane is powered;

(d) connecting a power electrical path by providing a power electrical path between said first electrical connector of said backplane and said second electrical connector of said field replaceable unit while said backplane is powered;

(e) permitting arcing to occur during step (d) at an arcing location on said first and/or said second electrical connector;

(f) establishing electrical power between said first electrical connector on said backplane and said second electrical connector of said field replaceable unit using a plurality of conductive contact surfaces other than said arcing location of first and said second electrical connectors; and (g) connecting at least one signal electrical path between said first and said second electrical connector.

* * * * *